(12) United States Patent
Ewing et al.

(10) Patent No.: US 8,004,827 B2
(45) Date of Patent: Aug. 23, 2011

(54) FUSE MODULE WITH MOVABLE FUSE HOLDER FOR FUSED ELECTRICAL DEVICE

(75) Inventors: Carrel W. Ewing, Incline Village, NV (US); Brandon W. Ewing, Reno, NV (US); Andrew J. Cleveland, Reno, NV (US); James P. Maskaly, Sparks, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

(21) Appl. No.: 12/820,129

(22) Filed: Jun. 21, 2010

(65) Prior Publication Data

US 2010/0259871 A1    Oct. 14, 2010

Related U.S. Application Data

(62) Division of application No. 12/264,161, filed on Nov. 3, 2008, now Pat. No. 7,742,284, which is a division of application No. 11/636,263, filed on Dec. 7, 2006, now Pat. No. 7,447,002.

(60) Provisional application No. 60/758,394, filed on Jan. 11, 2006, provisional application No. 60/852,726, filed on Oct. 18, 2006.

(51) Int. Cl.
*H02B 1/26* (2006.01)
*H02H 3/22* (2006.01)

(52) U.S. Cl. ........ 361/623; 361/622; 361/624; 361/642; 361/648; 307/112; 307/39; 337/186; 174/59

(58) Field of Classification Search .............. 361/62–64, 361/111, 118, 602, 609, 622–628, 642–648, 361/656, 715–727, 833, 856, 657, 836; 307/10.1, 307/39, 112, 29, 38, 41, 115, 125, 126, 141, 307/150, 141.4, 143; 340/635, 638, 664, 340/538, 656, 660; 174/48, 49, 70 C, 72 C, 174/59; 312/223.2, 223.3, 265.1, 265.3, 312/265.5; 439/620.08, 620.22, 620.27, 439/620.33, 651, 55, 65, 82, 92, 621, 535, 439/650, 652, 716
See application file for complete search history.

(56) References Cited

U.S. PATENT DOCUMENTS

| | | | | |
|---|---|---|---|---|
| 5,559,662 | A | * | 9/1996 | Happ et al. ............ 361/104 |
| 6,122,160 | A | * | 9/2000 | Hannula ................ 361/600 |
| 6,229,691 | B1 | * | 5/2001 | Tanzer et al. .......... 361/622 |
| 6,456,203 | B1 | * | 9/2002 | Schomaker et al. .... 340/638 |

(Continued)

*Primary Examiner* — Michael V Datskovskiy
(74) *Attorney, Agent, or Firm* — Holland & Hart LLP

(57) ABSTRACT

Described herein are various embodiments of a fuse module for fused electrical devices. According to one exemplary embodiment, a fuse module is mounted to the housing of a fused electrical device. The fused electrical device can include at least one power output displaced along the power distribution housing with the at least one power output electrically couplable to at least one power input. The fuse module can be electrically coupled to the at least one power input and electrically couplable to the at least one power outputs. Further, the fuse module can comprise at least one fuse holder that is movable between a first position in which a fuse held by the fuse holder is electrically couplable to the at least one power output and a second position in which a fuse held by the fuse holder not electrically couplable to the at least one power output and is exposed to allow access to the fuse.

6 Claims, 26 Drawing Sheets

U.S. PATENT DOCUMENTS

| | | | |
|---|---|---|---|
| 6,608,406 B2 * | 8/2003 | Bersiek | 307/125 |
| 7,005,996 B2 * | 2/2006 | Cabrera et al. | 340/639 |
| 7,141,891 B2 * | 11/2006 | McNally et al. | 307/39 |
| 7,173,821 B2 * | 2/2007 | Coglitore | 361/695 |
| 7,256,984 B2 * | 8/2007 | Kim et al. | 361/624 |
| 7,271,506 B1 * | 9/2007 | Bersiek | 307/125 |
| 7,365,964 B2 * | 4/2008 | Donahue, IV | 361/622 |

* cited by examiner

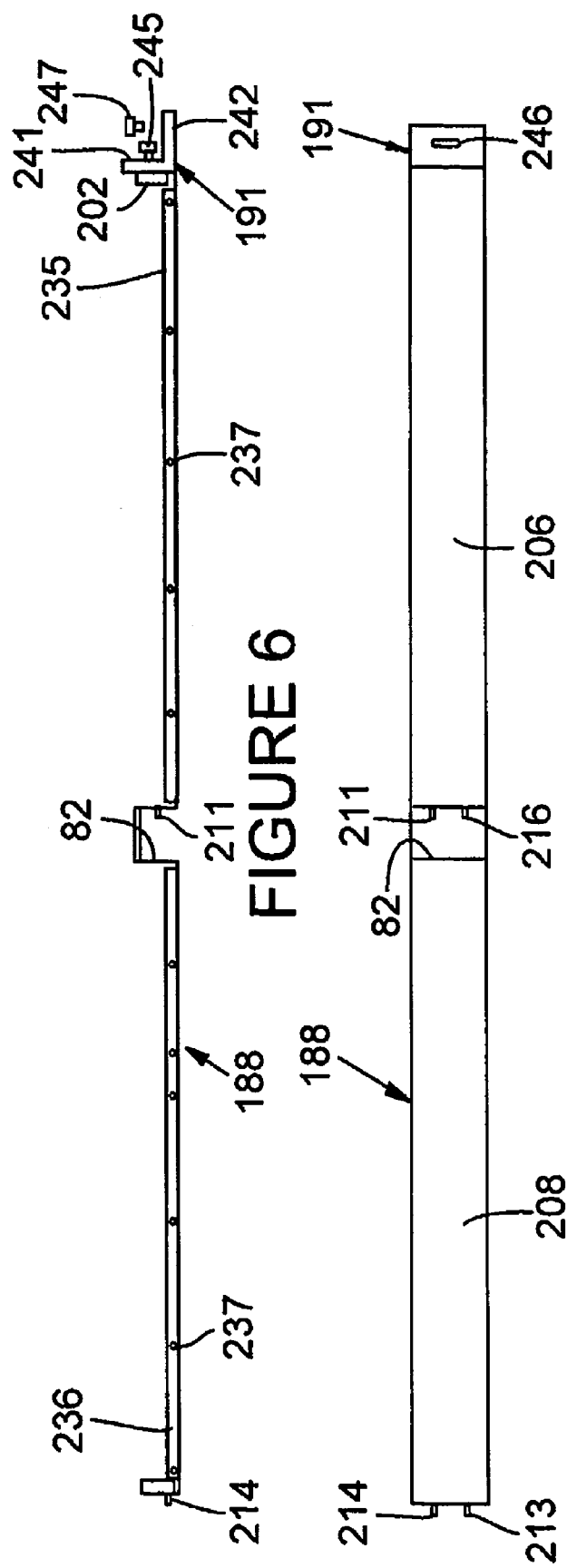

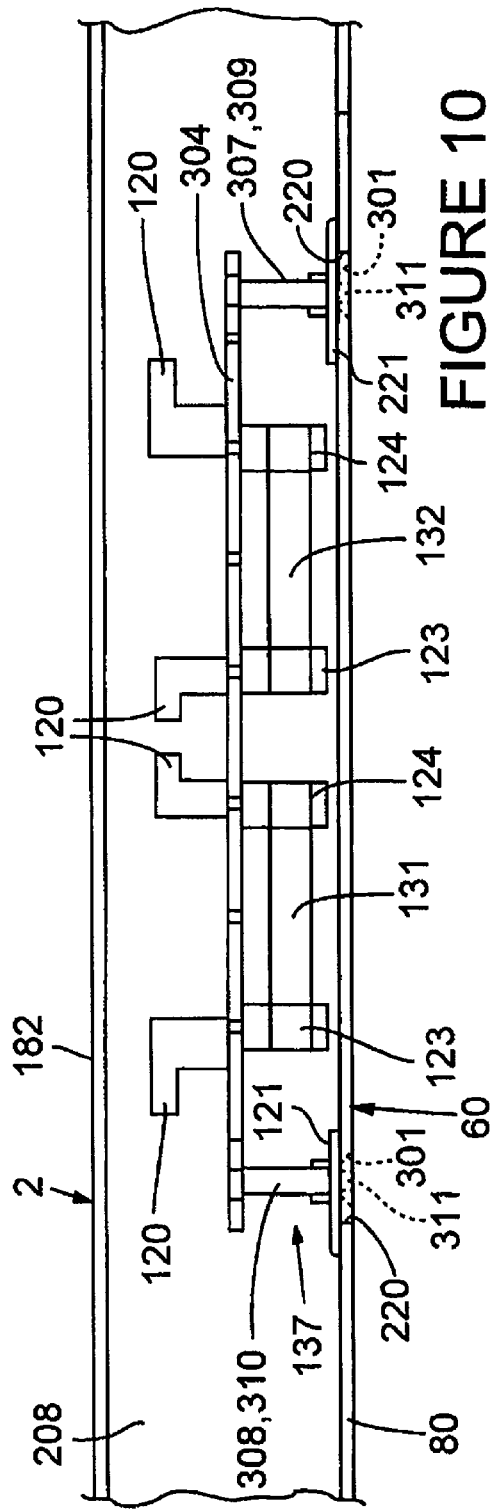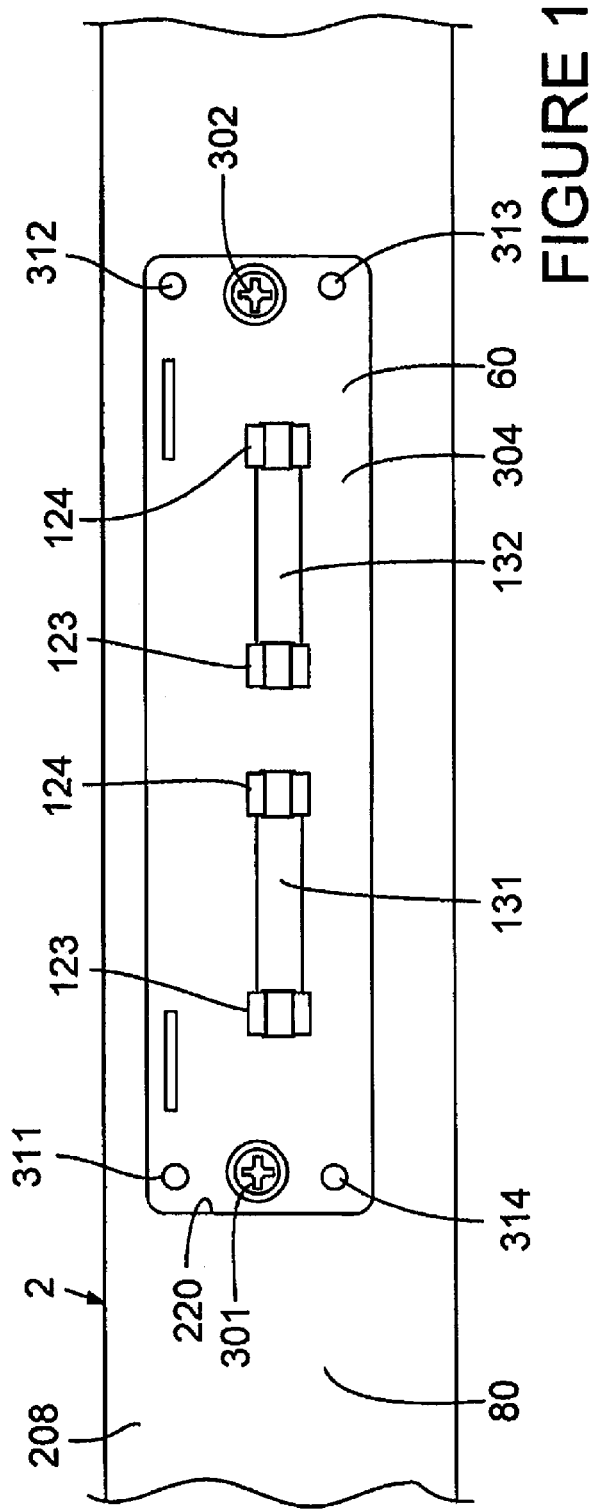

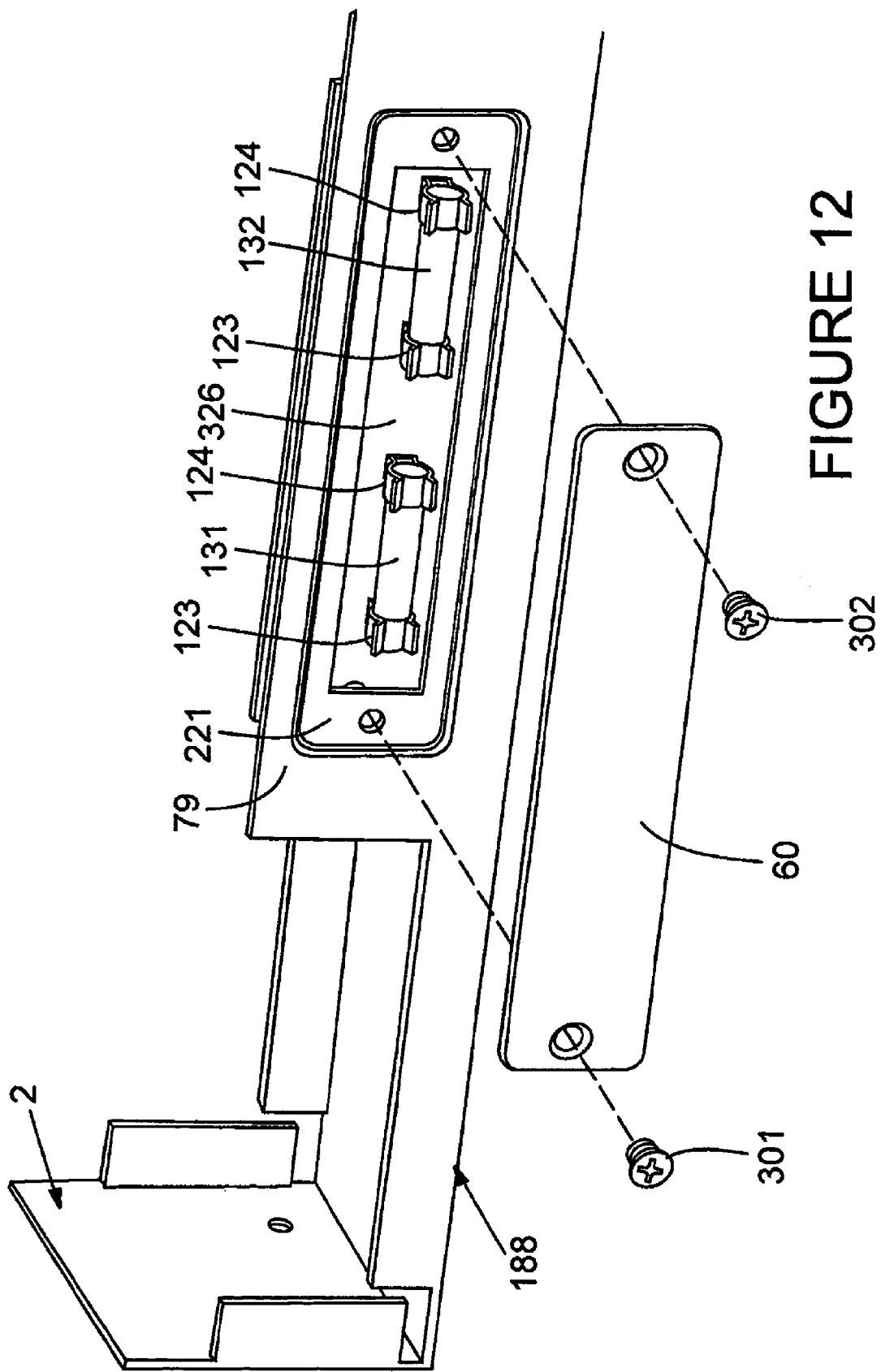

FUSE MODULE WITH MOVABLE FUSE HOLDER FOR FUSED ELECTRICAL DEVICE

CROSS REFERENCE TO RELATED APPLICATION

This patent application is a divisional of co-pending U.S. patent application Ser. No. 12/264,161 filed on Nov. 3, 2008, which is a divisional of U.S. patent application Ser. No. 11/636,263, filed on Dec. 7, 2006, which claims the benefit of U.S. Provisional Patent Application Nos. 60/758,394, filed Jan. 11, 2006, and 60/852,726, filed Oct. 18, 2006. These applications are incorporated herein by reference in their entirety.

FIELD

The present disclosure relates to a fused electrical apparatus having a housing allowing access to a fuse operable within the housing and more particularly, in one preferred form, to a fuse module having a movable fuse holder coupled to the housing.

BACKGROUND

Fuses are a common component found in many electrical devices. In general, fuses are electrical safety components consisting of a wire or strip that melts and interrupts a circuit when the current passing through the fuse exceeds a particular amperage. Once a fuse is blown, i.e., the wire or strip melts, the fuse must be replaced to re-establish the circuit.

Replacing blown fuses in fused electrical devices often requires disassembly of the electrical device and/or use of one or more hand-tools to access and retrieve a blown fuse. Accordingly, accessing and replacing a blown fuse can often be a difficult, cumbersome and time-consuming process.

It is therefore desirable to provide a more effective device and method for accessing and replacing blown fuses in fused electrical devices.

SUMMARY

Described herein are various embodiments of a fuse module for fused electrical devices and electrical devices comprising the same. The fuse module of the present application provides relatively easy access to fuses without requiring tools or disassembly of the electrical device to which the fuse module is associated.

According to one exemplary embodiment, at least one fuse module is mounted to the housing of a fused electrical device, such as a power distribution unit. The power distribution unit can receive at least one power input and have at least one power output to provide power to associated electronic equipment. More specifically, the power distribution unit can include at least one power output displaced along the power distribution housing with the power output electrically couplable to the at least one power input. The fuse module can be electrically coupled to the at least one power input and electrically couplable to the at least one power output. Further, the fuse module can comprise at least one fuse holder movable between a first or "service" position in which a fuse held by the fuse holder is electrically couplable to the at least one power output and a second or "retracted" position in which a fuse held by the fuse holder is not electrically couplable to the at least one power output and is exposed to allow access to the fuse.

In certain implementations, the fuse holder is rotatable between the first and second positions. A fuse held by the fuse holder can be generally inaccessible from outside the housing when the fuse holder is in the first position and accessible from outside the housing when the fuse holder is in the second position. In certain exemplary implementations, the fuse can be a cartridge-type fuse.

In specific implementations, the fuse module can further comprise at least one fuse terminal electrically coupled to the at least one power input and electrically couplable to the at least one power outlet. The at least one fuse terminal can be in removably receiving communication with a fuse held by the fuse holder when the holder is in the first position. In the first position, the fuse and fuse terminal act to electrically couple the at least one power input and the at least one power outlet.

In some implementations, a printed circuit board can be disposed within the power distribution unit housing. The printed circuit board can be electrically connected to the at least one power input and the at least one power outlet. In specific implementations, the fuse module can comprise at least one fuse clamp electrically coupled to the printed circuit board. The at least one fuse clamp can be in removably receiving communication with a fuse held by the fuse holder when the holder is in the first position. The fuse and fuse terminal act to electrically couple the at least one power input and the at least one power outlet via the printed circuit board. In certain implementations, the at least one fuse clamp can comprise opposing fuse clamp arms biased to removably receive and secure a fuse held by the at least one fuse holder when the fuse holder is in the first position.

In some implementations, the at least one fuse holder can comprise a tab portion external to the housing and engageable by a user to move the fuse holder between the first and second positions.

In some implementations, the at least one fuse module can comprise a base fixedly attached to an external portion of the power distribution unit housing. The fuse holder can be movably coupled to the fuse carrier base.

In some implementations, the at least one fuse module can comprise at least two fuse holders.

In still some implementations, at least one fuse condition indicator can be in electronic communication with a fuse held by the retractable fuse holder when the fuse holder is in the first position. In some implementations, the at least one fuse access passage comprises a plurality of fuse access passages, the at least one power output comprises a plurality of power outputs, and the at least one fuse module comprises a plurality of fuse modules. In specific implementations, at least two of the plurality of power outputs are interconnected to form a bank of power outputs.

In one specific exemplary implementation, the base can comprise opposing resilient tabs and the at least one fuse holder is pivotably secured to the base at one end of the holder by the resilient tabs. The at least one fuse holder can pivot away from the power distribution unit housing when the holder moves from the first position to the second position. The base can substantially cover the at least one fuse access passage and have a fuse holder access opening adjacent the fuse access passage. When in the first position, the at least one fuse holder extends through the fuse access passage and the fuse holder access opening. The fuse module can also comprise a printed circuit board and at least first and second terminals attached to the printed circuit board. The first terminal can be electrically couplable to the at least one power input and the second terminal can be electrically couplable to the at least one power output. Each of the first and second terminals can comprise opposing resiliently movable arms.

The at least one fuse holder can also have a body and fuse support arm extending from the body. The body and the fuse support arm can define a fuse receiving area within which a fuse can be positioned. The fuse can be removably secured between the respective opposing resiliently movable arms of the respective first and second terminals when the holder is in the first position.

One exemplary method for accessing fuses in a power distribution unit of the type for receiving at least one power input and having at least one power output to provide power to associated electronic equipment can comprise providing at least one fuse module mountable to a housing of the power distribution unit. The fuse module can comprise at least one retractable fuse carrier configured to removably secure an electrical fuse. The method can further include moving the retractable fuse carrier from a first position to a second position by applying pressure to the fuse carrier. The first position is a position in which a first fuse carried by the retractable fuse carrier is electrically connected to the at least one power input and the at least one power output. The second position is a position in which the first fuse carried by the retractable fuse carrier is electrically disconnected from the at least one power output.

In some implementations, the method can also include removing the first fuse from the retractable fuse carrier when the retractable fuse carrier is in the second position and coupling a second fuse to the retractable fuse carrier when the retractable fuse carrier is in the second position. The method can further include moving the retractable fuse carrier from the second position to the first position. The second position then being a position in which the second fuse carried by the retractable fuse carrier is electrically disconnected from the at least one power input. The first position then being a position in which the second fuse carried by the retractable fuse carrier is electrically connected to the at least one power input and the at least one power output.

It is intended that the above method steps, and other method steps described herein, need not be performed in any particular order unless otherwise noted.

According to one exemplary embodiment, a fuse module for use with a fused electrical device for receiving at least one power input and having at least one electrical component can comprise a base mountable to the fused electrical device. The fuse module can also comprise at least one fuse carrier coupled to the base and movable relative to the base. In certain implementations, the assembly comprises two or more carriers. The at least one fuse carrier is capable of removably securing a fuse and being selectively movable between a first position and a second position. The fuse module can also include at least a first fuse terminal capable of being in electrical communication with the at least one power input and at least a second fuse terminal capable of being in electrical communication with the at least one electrical component. The first and second fuse terminals can be fixed relative to the base and be in removably retaining communication with a fuse carried by the fuse carrier when the fuse carrier is in the first position to electrically connect the fuse and the first and second fuse terminals. In specific aspects of the fuse module, the at least one fuse carrier is movable from the first position to the second position to remove the fuse from retaining communication with the first and second fuse terminals to electrically disconnect the fuse from the fuse terminals.

In some implementations where the base is mounted to a fused electrical device, the fuse carrier can comprise a user engaging portion positioned externally to the fused electrical device. The fuse carrier can also comprise a fuse retaining portion positioned within the fused electrical device when the carrier is in the first position and positioned externally to the fused electrical device when the fuse carrier is in the second position.

In some specific exemplary implementations, the fuse module can have a body and a fuse support arm extending from the body where a fuse receiving area is defined between the body and the support arm. In one implementation, the support arm can be resiliently movable relative to the body to removably secure a fuse within the fuse receiving area. In another implementation, the fuse carrier can have lateral support portions extending about the fuse receiving area between the body and the support arm, and a stop extending from the body. The lateral support portions are capable of resisting movement of a fuse positioned in the fuse receiving area in a lateral direction and the stop is capable of resisting movement of the fuse in a longitudinal direction.

In some specific exemplary implementations, the fuse module base can include a first sidewall and a corresponding second sidewall extending generally parallel to each other to define a carrier receiving area therebetween. The fuse carrier can be pivotably attached to the first and second sidewalls within the carrier receiving area to accommodate rotatable movement of the fuse carrier between the first and second positions and at least partially within the carrier receiving area.

In other implementations where the base is mounted to a fused electrical device, a fuse carried by the fuse carrier is positioned within the electrical device when the fuse carrier is in the first position and externally to the device when the fuse carrier is in the second position.

In some implementations, the first and second fuse terminals can comprise two opposing resiliently flexible portions adapted to flex to removably retain a fuse carried by the fuse carrier between the flexible portion when the fuse carrier is in the first position.

In some implementations, the fuse module can further comprise a printed circuit board electrically couplable to the at least one power input and the at least one electrical component of the fused electrical device. The first fuse terminal can be electrically coupled to the printed circuit board and electrically couplable to the at least one power input and the second fuse terminal can be electrically coupled to the printed circuit board and electrically coupleable to the electrical component via the printed circuit board.

In some implementations, the fuse carrier is rotatable relative to the base. In these implementations, the fuse carrier can be selectively rotatable between the first position and the second position.

In some implementations, the fuse module can include at least one fuse condition indicator associated with a fuse carried by the fuse carrier. The fuse condition indicator can be in electrical communication with the fuse carried by the fuse carrier when in the fuse carrier is in the first position.

In one exemplary embodiment, an electrical equipment rack assembly can comprise an electronic equipment rack for housing electronic equipment, a power distribution unit having a housing mounted to the electronic equipment rack and at least one fuse module mounted to the power distribution unit housing. In specific implementations, the power distribution unit is vertically mounted to the electronic equipment rack. In yet other implementations, the power distribution unit is horizontally mounted to the electronic equipment rack The foregoing and other features and advantages will become more apparent from the following detailed description, which proceeds with reference to the accompanying figures.

BRIEF DESCRIPTION OF THE DRAWINGS

FIGS. 6 and 7 are a side view and a plan view of a back panel of the housing of the apparatus of FIG. 1.

FIG. 8 is an elevational view of the remaining side wall of the housing of the apparatus of FIG. 1.

FIGS. 10 and 11 are a partial plan view with the front panel removed and a partial elevational view of one exemplary embodiment of a fuse assembly included in the apparatus of FIG. 1.

FIG. 12 is an exploded partial perspective view showing another embodiment of a fuse assembly.

DETAILED DESCRIPTION

Embodiments of a fuse module with a movable fuse holder for use with a fused electrical apparatus are described herein. As defined herein, a fused electrical apparatus can be any electrical apparatus configured or configurable to provide overcurrent protection to one or more components of the electrical apparatus or components connected to the electrical apparatus. Although the illustrated embodiments are described in relation to an electrical power distribution unit (PDU) having one or more power inputs and power outputs, it is recognized that any of various other types of fused electrical apparatus, such as, for example, radios, televisions, computers, machining equipment and appliances, can be used.

Figure 1:
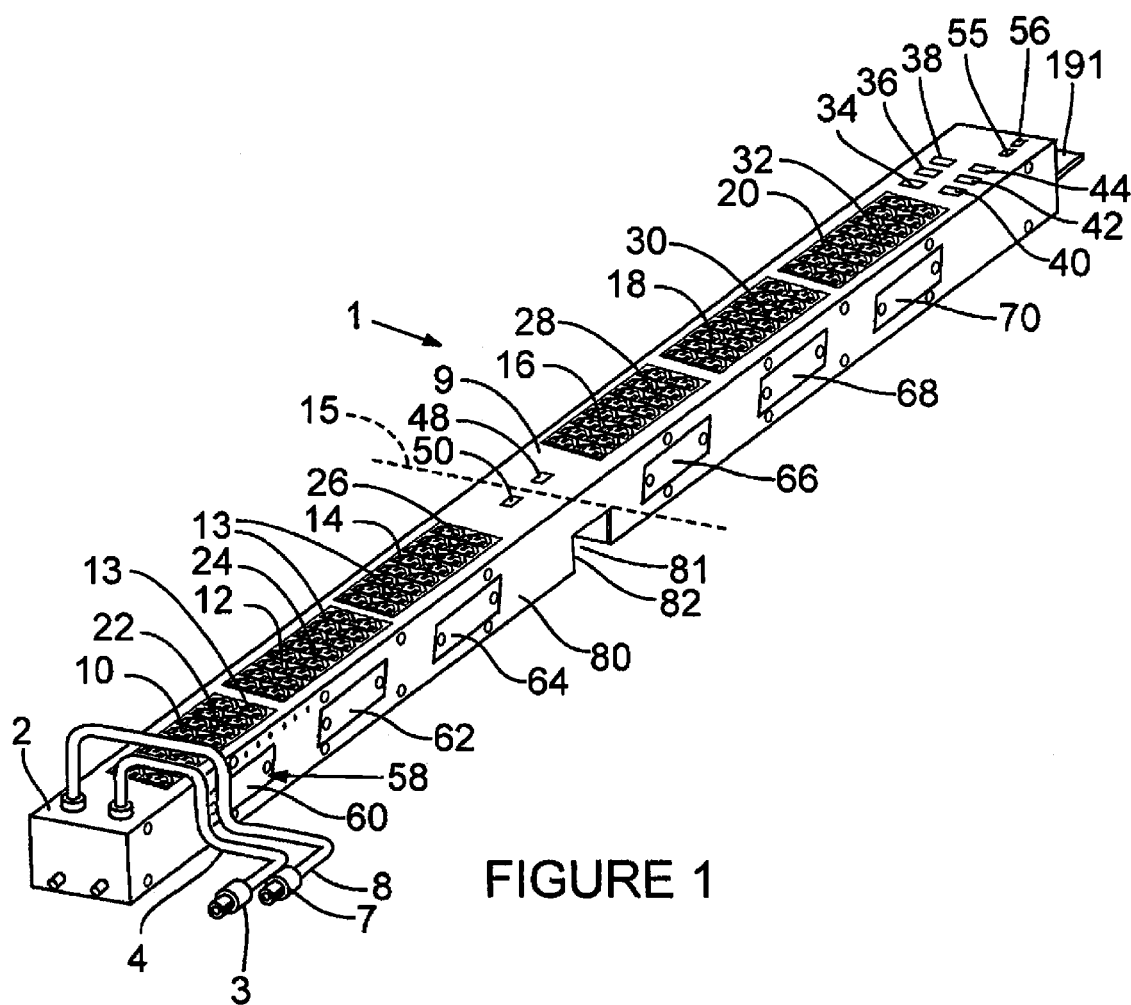
FIG. 1 is an axonometric view of a power distribution apparatus constructed in accordance with one specific exemplary implementation.

Referring to FIG. 1, the fused electrical apparatus is an electrical PDU, such as PDU 1, that is adapted to receive one or more polyphase, or single-phase, power inputs and has a plurality of outputs, such as single-phase power outputs. The description of a PDU is merely for exemplary purposes and is not limiting in any way. Moreover, the particular embodiments of PDUs described herein are merely examples of PDUs It should be noted that this specification employs spatially orienting terms to explain relative locations. In order to provide orientation with respect to the housing 2, the vertical dimension is also referred to as the longitudinal dimension. The horizontal dimension across the front panel 9 is the lateral dimension. The third dimension perpendicular to the surface of the front panel 9 is the transverse dimension.

With continuing reference to FIG. 1, a first three-phase plug 3, which in this example is for a three-phase application, is connected to a three-phase alternating current source (not shown). A first power cord 4 couples power to the housing 2. A second three-phase plug 7 may be connected to the three-phase alternating current source. A second power cord 8 couples power to the housing 2 from the second plug 7. The three phases provided through the first plug 3 are arbitrarily referred to as phases A, B, and C. The three phases provided through the second plug 7 are arbitrarily referred to as X, Y, and Z.

Figure 2:
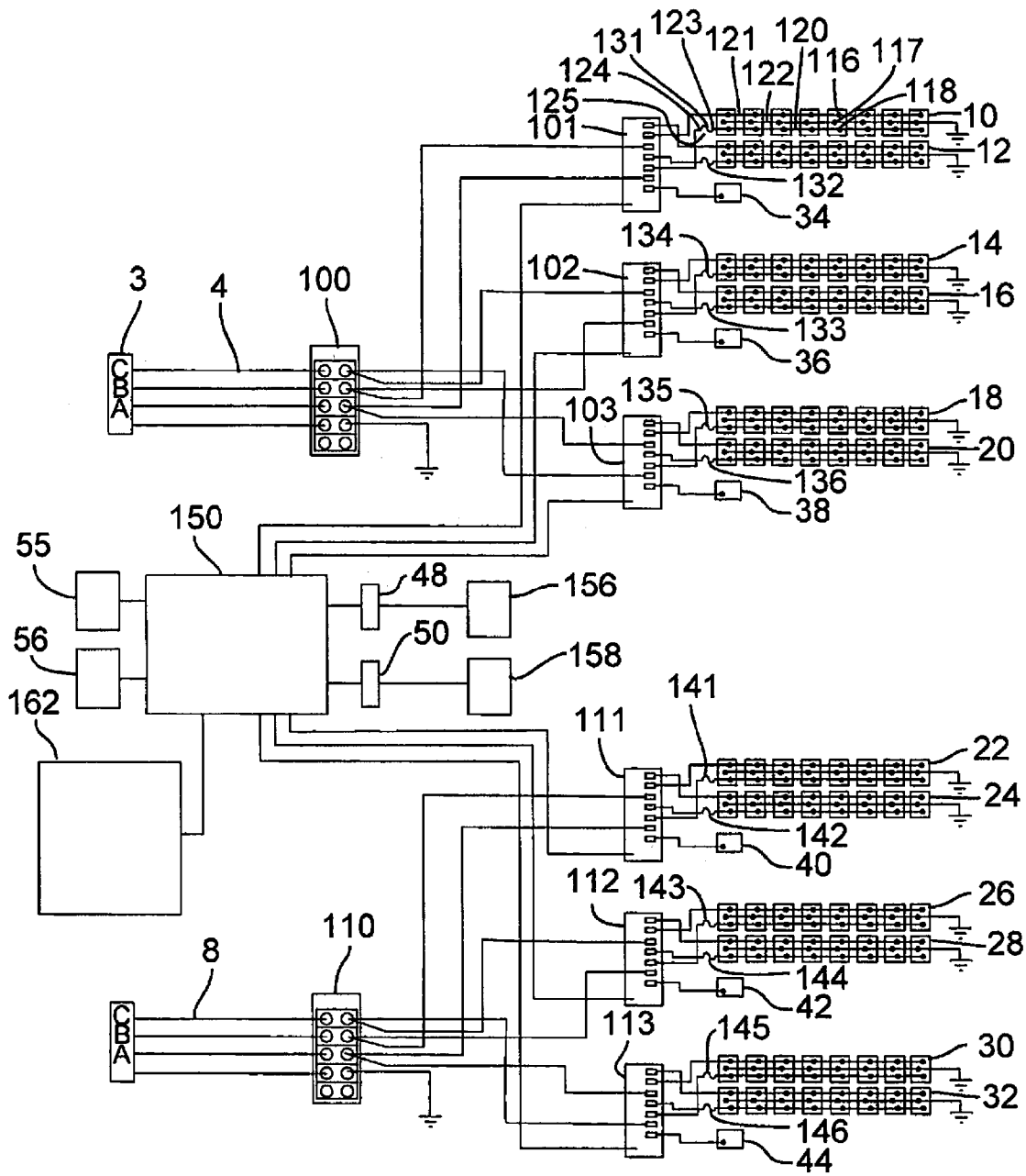
FIG. 2 is a schematic illustration of the apparatus of FIG. 1.

With reference now to FIG. 2, circuitry in the housing 2 divides the three phase alternating current into a plurality of single phase inputs to components plugged in to the PDU 1. At a front panel 9 of the housing 2, single phase voltage is provided at one or more outlets, which can be arranged individually or interconnected in outlet modules or banks as will be further described below.

The present embodiment utilizes separate first and second plugs 3 and 7 so that multiple power inputs can be provided, such as for a data center, telecommunications central office, or broadcast network equipment rack. Alternatively, a single power input could be provided.

The elongated dimension of the housing 2 may be referred to as the vertical direction because in some implementations, when the housing 2 is mounted in a rack assembly, the front panel 9 is disposed in a vertical plane. Notwithstanding the elongated dimension being referred to as the vertical direction, it is recognized that in some implementations, the front panel of the housing 2 or, in other implementations, the front panel of a housing of another fused electrical device, can be disposed in a horizontal (see FIGS. 34 and 35), diagonal, or other plane when mounted in a rack. Accordingly, the fused electrical devices as described herein are not limited to any particular orientation independent of or with respect to an electronic equipment rack.

First and second power receptacle banks, or ganged outlets, 10, 12 extend vertically adjacent a lower end of the housing 2. Each bank comprises a plurality of power receptacles, such as eight power receptacles 13 as shown in some of the illustrated embodiments, interconnected together.

Each receptacle 13 may comprise a standard 120 volt grounded outlet. Third and fourth power receptacle banks 14, 16 extend vertically above the first and second power receptacle banks 10, 12 and may be on opposite sides of a vertical centerline 15 of the front panel 9. Fifth and sixth power receptacle banks 18, 20 extend successively vertically above the third and fourth power receptacle banks 14, 16. Seventh and eighth power receptacle banks 22, 24 are vertically aligned and horizontally adjacent to the banks 10, 12 respectively. Ninth and tenth power receptacle banks 26, 28 are vertically aligned and horizontally adjacent to the third and fourth banks 14, 16 respectively. Similarly, eleventh and twelfth power receptacle banks 30, 32 are vertically aligned with and horizontally adjacent to the fifth and sixth power receptacle banks 18, 20.

Other numbers of power receptacle banks could be provided and each power receptacle bank could include a different number of receptacles 13. Other phase connections could be made. The various banks of receptacles may be connected to different ones of the phases A, B and C and X, Y and Z. In the present embodiment, the banks of receptacles are connected as will described with reference to FIG. 2 below.

In a preferred form, the electrical apparatus includes displays 34, 36, 38, 40, 42, 44 for respectively displaying the currents drawn in each of phases A though C and X through Z. The displays may be located on the front panel 9 between the power receptacle banks 20 and 32 and an upper, or longitudinally distal, end of the housing 2. A first set of three displays 34, 36, 38 are aligned in a first vertical column, and a second set of three displays 40, 42, 44 are aligned in a second vertical column laterally adjacent to the first vertical column of the first set of displays 34, 36, 38. Preferably, each one among the displays 34-44 indicates RMS current levels for a particular phase of power provided by the PDU 1 (in this case, A, B, C, X, Y, and Z respectively).

The PDU 1 may be a power distribution apparatus having particular features, such as intelligent power distribution, remote power management, power monitoring, and environmental monitoring. An example of such a system is the Dual-Feed Power Tower XL manufactured by Server Technology, Inc. of Reno, Nev. For this type of power distribution unit, further interface ports, described below, are provided in the front panel 9.

Figure 20:
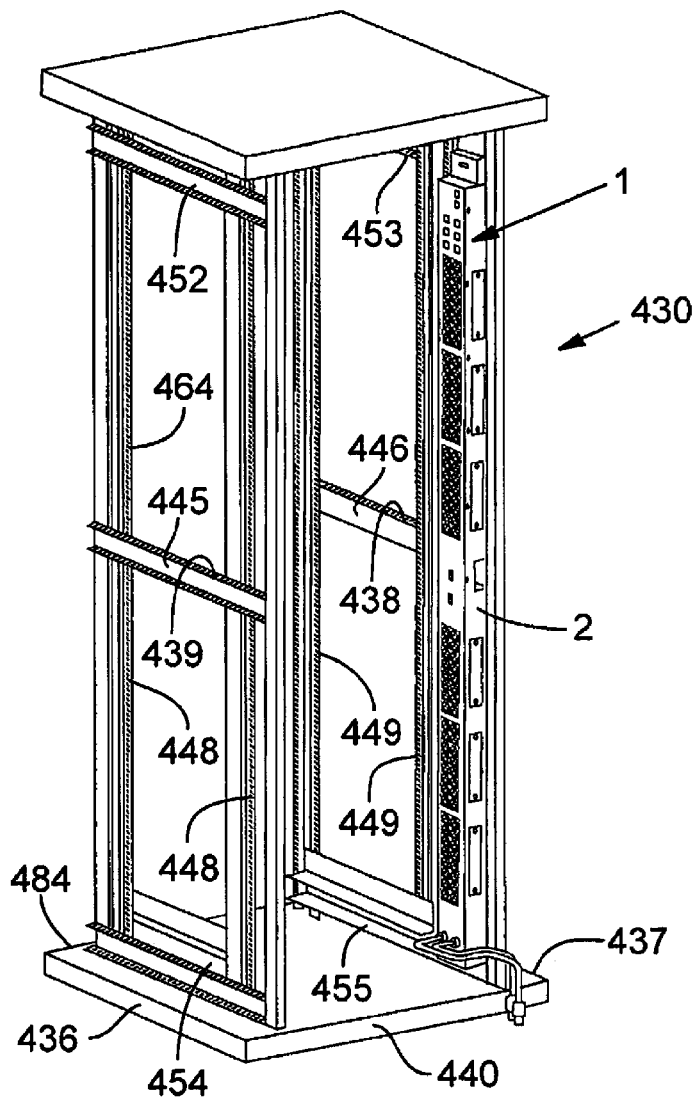
FIG. 20 is a perspective view of the apparatus of FIG. 1 mounted vertically in an electronic equipment rack.
Figure 21:
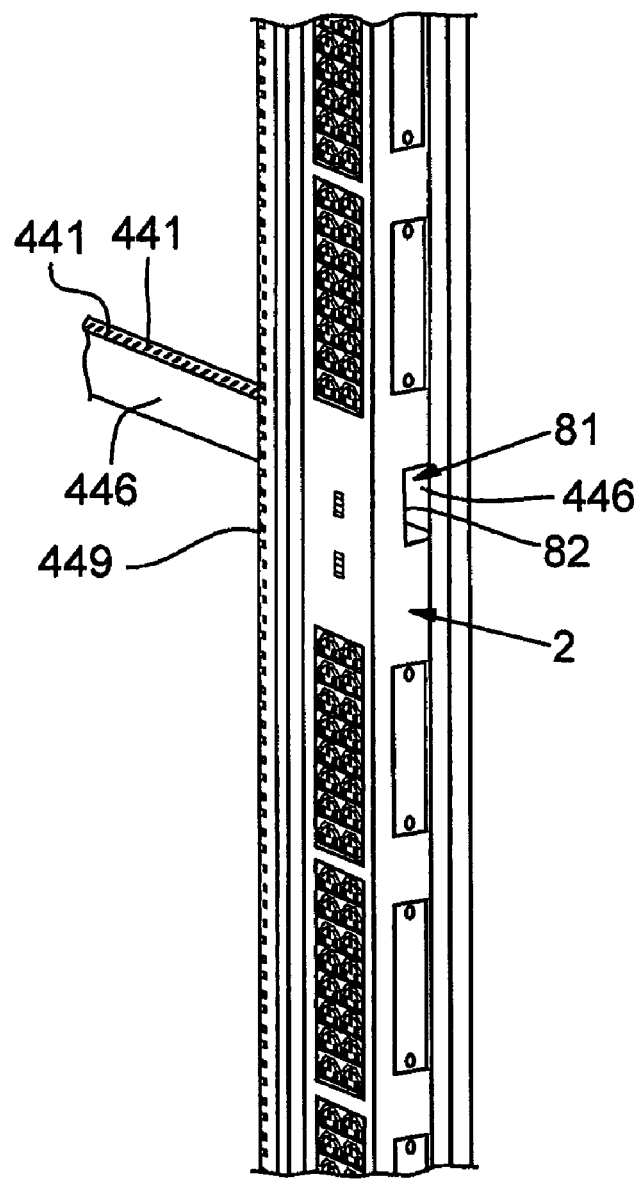
FIG. 21 is a partial detailed view of FIG. 20.
Figure 22:
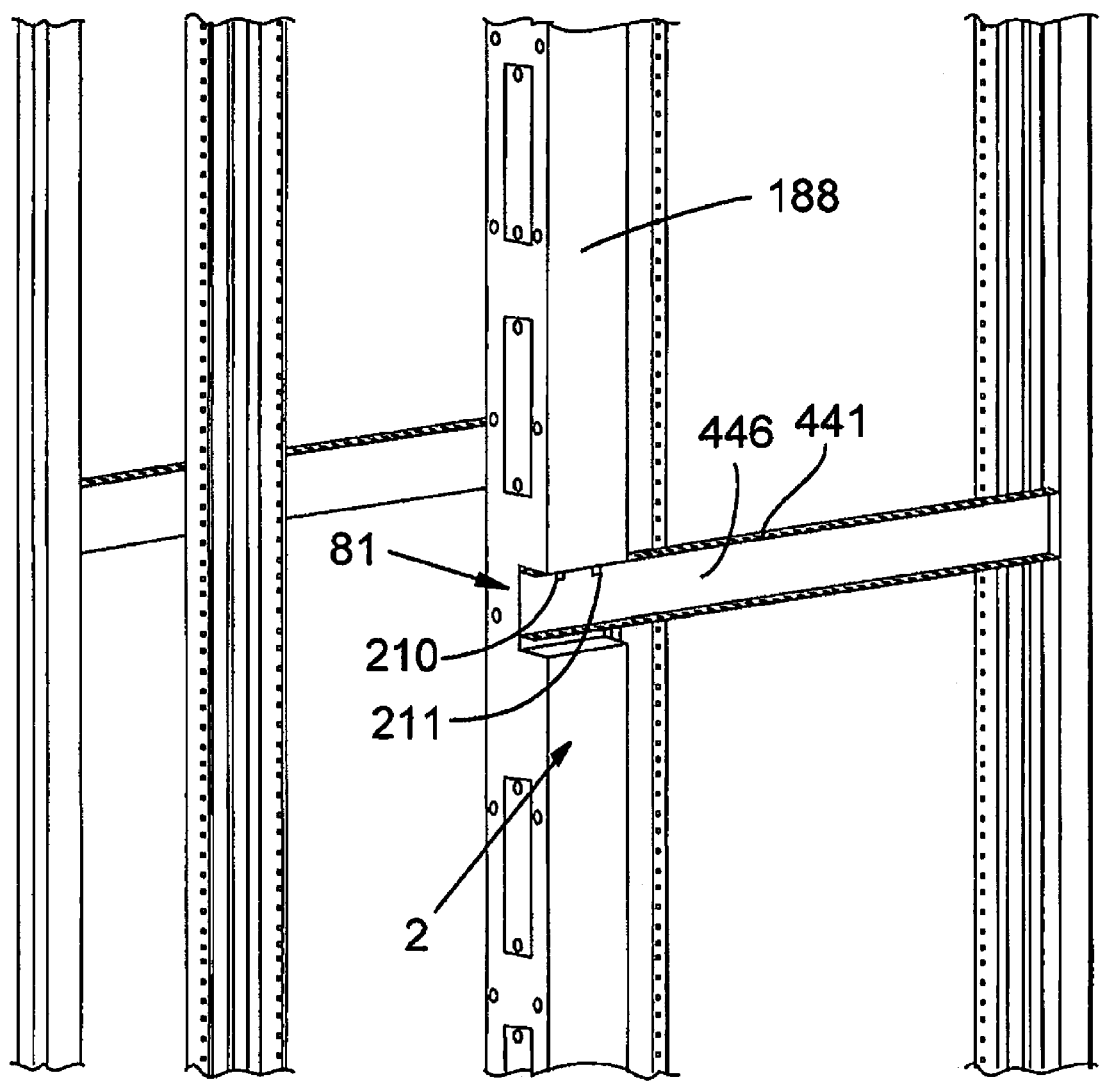
FIG. 22 is a partial detailed view of FIG. 20 but showing an opposite side of the apparatus.

Although increasing the number of vertically racked or stacked servers, such as shown in the embodiment of FIGS. 20-22, can conserve valuable floor space, the resulting power consumption and heat dissipation associated with the serves can create new concerns for data center managers. Once temperature increases above a particular threshold, data system server failure rates increase 2-3 percent for every one degree rise in temperature. First and second environmental monitoring ports, such as monitoring ports 48, 50 shown in FIG. 1, can be provided in the longitudinal center of the front panel 9 to receive input signals indicative of temperature and humidity, respectively, from a measurement device, such as one commonly used in the art.

In some implementations, communications interfaces are provided by first and second communications ports 55, 56 at the upper end of the front panel 9. The first and second ports 55, 56 may comprise RJ-45 connectors. In specific implementations, the first communications port 55 may be a serial, RS-232 port and the second communications port 56 may be an Ethernet port.

In the power distribution of FIG. 1, each bank of receptacles is "fused." In other words, each of the power receptacle banks 10, 12, 14, 16 18, 20, 22, 24, 26, 28, 30, 32 are each protected by a fuse as will be further described below. As shown, and which will be described in more detail below, the fuses are made accessible without the need to disassemble the housing 2, e.g., as by removing the front panel 9 from the housing 2.

In some embodiments, the PDU 1 comprises fuse state indicators, such as fuse state indicators 58, so that the state of the fuse may be determined by visual inspection. In the embodiment of FIG. 1, the PDU 1 has six fuse state indicators 58 with each indicator comprising a window, such as windows 60-70, through which two fuses can be visible. In other embodiments, other numbers of fuses can be mounted behind each window 60-70.

In the present example, removable window 60 provides not only access to fuses within the housing 2 but also an indication of the states of fuses for the first and sixth banks 22, 24. Similarly, windows 62, 64, 66, 68, 70 are indicators for fuses associated with banks 10 and 12, 26 and 28, 14 and 16, 30 and 32, and 18 and 20, respectively. Each of the windows 60-70 can be generally planer shaped and removable in a manner as will be described below in more detail to provide access to fuses. In some implementations, the windows 60-70 may be made from, for example, Lucite, polycarbonate resin, or other transparent, or semi-transparent, material.

The windows 60-70 are mounted in or over apertures 220-230 (see, in particular, FIG. 5), respectively, formed in a first side wall 80 of the housing 2. In some implementations, the side wall 80 can be joined to and extend substantially perpendicular to the front panel 9. The apertures 220-230 formed in first side wall 80 are located laterally adjacent the fuses mounted within the housing 2 such that the fuses are observable through the apertures 220-230 and fuse windows 60-70 mounted in or over the apertures.

Although not specifically shown, in some embodiments, the apertures can be formed in the front panel 9 or rear panel 188 of the PDU housing 2. For example, apertures can be formed in the front panel 9 adjacent one or more of the power receptacle banks, such as between two adjacent power receptacle banks.

Fuses of the type used in power distribution apparatus change in physical appearance, as by taking on a burnt look for example, when they blow or become inoperable. The fuse status of these types of fuses can be indicated by viewing through one of the corresponding windows 60-70.

In alternative embodiments, as will be discussed in more detail below, the status of a fuse may be indicated by a device that actively indicates the status of the fuse, such as, for example, a light emitting diode (LED). The LED may be on or off in correspondence with the state of the fuse so as to provide an indicator of fuse condition that is viewable at a substantial distance away from the housing 2.

In specific implementations, the housing 2 can include a rack mounting section 81. As can be seen in FIG. 1, the rack mounting section 81 includes a mounting contour, or channel, 82 formed in the housing 2. The mounting contour 82 can comprise a rectangular cutout in the plane of the first side wall 80 having one side in line with a rear wall 208 (see FIG. 3) of the housing 2. The contour 82 thus provides a generally U-shaped detent or mounting channel in the housing 2.

The rack mounting section 81 can also include other components for securing the housing 2 in a given spatial relationship in a rack, as will be described below in more detail with reference to FIG. 3. The mounting contour 82 facilitates mounting of the housing 2 in a conventional electronic equipment rack assembly, such as a RETMA rack.

As further described with respect to the embodiment of FIG. 20 below, the rack mounting section 81 allows the housing 2 to be removably positioned or mounted vertically on the rearward portion of a horizontal mounting rail in an equipment rack assembly. In this fashion, the housing 2 may be mounted substantially or even entirely within the internal confines of the equipment rack assembly, reducing wiring and equipment access space consumption within the equipment rack assembly, and allowing wiring to and from the housing 2 and associated electronic equipment in the rack assembly to be easily, safely, and securely maintained within the confines of the rack.

FIG. 2 is a schematic illustration of the PDU 1. In FIG. 2, the same reference numerals are used to denote items corresponding to those in FIG. 1. The first power cord 4 is connected to a first main terminal block 100 which in turn is connected to and transmits power to first, second, and third bank supply terminal blocks 101, 102, 103. Similarly, the second power cord 8 is connected to a second main terminal block 110, which is connected to and transmits power to fourth, fifth, and sixth bank supply terminal blocks 111, 112, 113.

The first bank supply terminal block 101 couples phases A and B to the first and second power receptacle banks 10, 12, respectively. The second bank supply terminal block 102 couples phases B and C to third and fourth power receptacle banks 14, 16, respectively. The third bank supply terminal block 103 couples phases C and A to fifth and sixth power receptacle banks 18, 20, respectively.

Similarly, the fourth bank supply terminal block 111 couples phases X and Y to seventh and eighth power receptacle banks 22, 24, respectively. The fifth bank supply terminal block 112 couples phases Y and Z to ninth and tenth power receptacle banks 26, 28, respectively. The sixth bank supply terminal block 113 couples phases Z and X to eleventh and twelfth power receptacle banks 30, 32, respectively.

As denoted in the diagram of the first power receptacle bank 10, which is illustrative of the wiring and fusing of all power receptacle banks identified above, each receptacle 13 has a first terminal 118 connected to a first phase input line 120, a second terminal 116 connected to a second phase input line 121 and a third terminal 117 connected to a grounded line 122. In some implementations where the power source provides a single phase line-neutral power input, the second phase input line 121 can be a neutral return line.

The receptacles 13 of the representative first power receptacle bank 10 are fused together via the line 120. Each line 120 includes fuse mount terminals 123, 124 connected to opposite ends of a fuse 131. Accordingly, fuse 131 electrically couples the phase input line 120 of the first power receptacle bank with the first bank supply terminal block 101. One or more pairs of first and second fuse mount terminals 123, 124 may be included in a fuse holder 125. The first and second fuse mount terminals 123, 124 may consist of lugs soldered to fuses, fuse clips or other fuse mounting structures available or known in the art.

Similar to fuse 131, fuse 132 electrically couples the phase input line 120 of the second power receptacle bank 12 with the first bank supply terminal block 101. Similarly, fuses 133, 134 electrically couple the phase input line 120 of the third and fourth power receptacle banks 14, 16, respectively, with the second bank supply terminal block 102. Fuses 135, 136 electrically couple the phase input line 120 of the fifth and sixth power receptacle banks 14, 16, respectively, with the third bank supply terminal block 103. Fuses 141, 142 electrically couple the phase input line 120 of the seventh and eighth power receptacle banks 22, 24, respectively, with the fourth bank supply terminal block 111. Fuses 143, 144 electrically couple the phase input line 120 of the ninth and tenth power receptacle banks 26, 28, respectively, with the fifth bank supply terminal block 112. Fuses 145, 146 electrically couple the phase input line 120 of the eleventh and twelfth power receptacle banks 30, 32, respectively, with the sixth bank supply terminal block 113.

A control circuit 150 is coupled to each of the first through third bank supply terminal blocks 101-103 and each of the fourth through sixth bank supply terminal blocks 111-113. The control circuit 150 may provide the intelligent power distribution, remote power management, power monitoring and environmental monitoring as provided in the above-cited Dual-Feed Power Tower XL system. The structure and operation of the control circuit 150 do not form part of the present invention although the control circuitry 150 has novel and unexpected interactions in the context of the present embodiment. The control circuit 150 interfaces with the first, second, and third bank supply terminal blocks 101, 102, 103 to provide RMS current signals coupled to the associated first, second, and third RMS current level displays 34, 36, 38, respectively. Similarly, the control circuit 150 is coupled by the fourth, fifth, and sixth bank supply terminal blocks 111, 112, 113 to provide current signals to the associated fourth, fifth, and sixth RMS current level displays 40, 42, 44, respectively.

The first though sixth bank supply terminal blocks 101, 102, 103, 111, 112, and 113 are also coupled to provide inputs to the control circuit 150. Calculation of an RMS current signal is done in a known manner. For example, phase current measurement is provided in the above-cited Dual-Feed Power Tower XL system.

The first and second environmental monitoring ports 48, 50 are connected to the control circuit 150 and receive inputs from a temperature sensor 156 and a moisture sensor 158, respectively. The above-cited Dual-Feed Power Tower XL system also provides for IP (internet protocol) network functionality. The control circuit 150 is connected to the first and second communications ports 55, 56 to communicate the status of the system. A condition-sensing circuit 162 is coupled to the control circuit 150 to report on such conditions as an open circuit in series with one of the bank supply terminal blocks 101-103 or 111-113.

Although the circuit diagram of FIG. 2 includes main and bank supply terminal blocks, in some embodiments, the terminal blocks are not included and the various electrical components interconnected via the terminal blocks are, in some cases, directly electrically connected to each other.

The structure of the housing 2 of FIG. 1 is further understood with reference to FIGS. 3-8. Generally, the PDU 1 can be comprised of adjoining panels and walls, such as first side panel 80 described above, forming a generally elongate rectangular shape.

Figure 3:
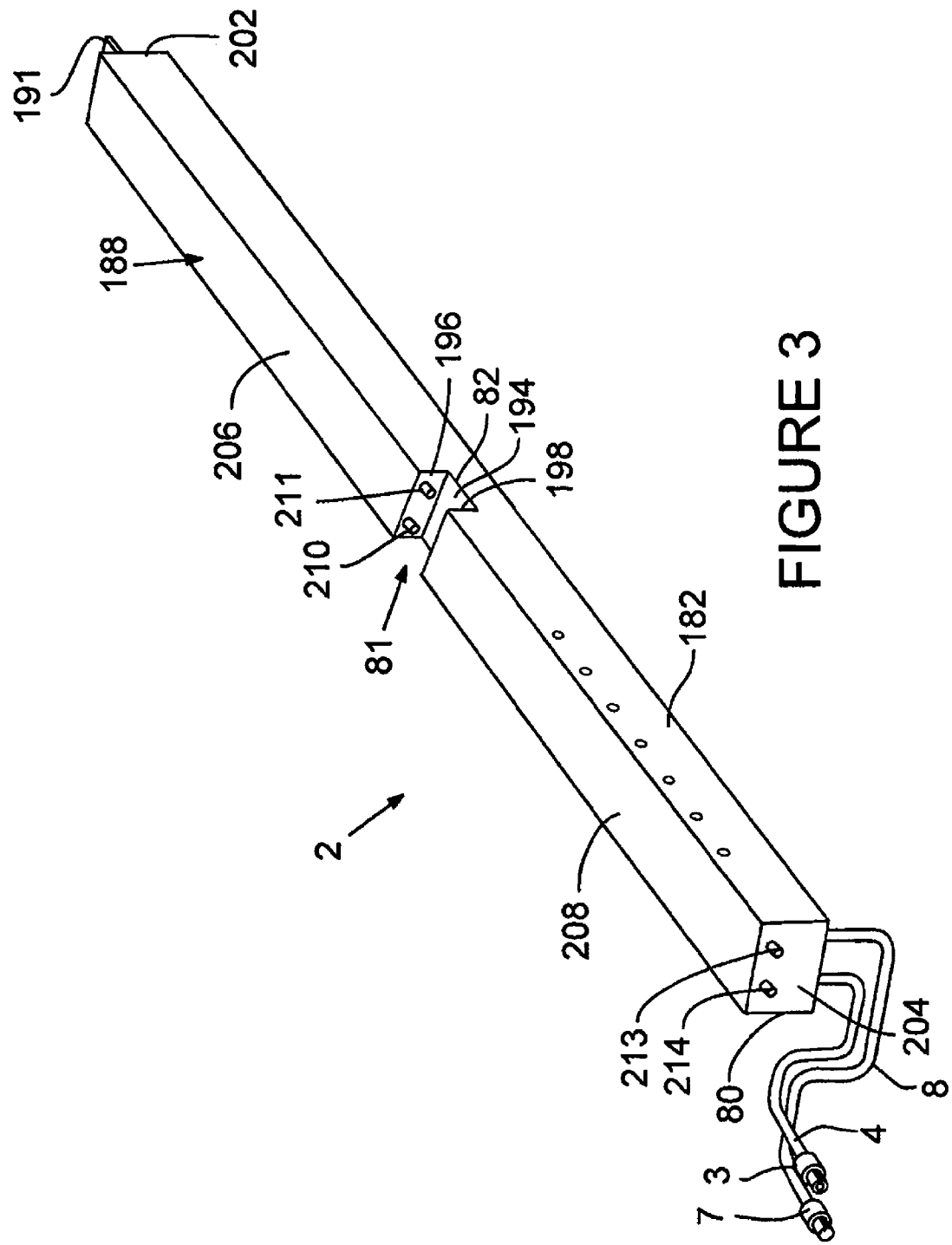
FIG. 3 is an axonometric view of a back side of the apparatus of FIG. 1.
Figure 4:
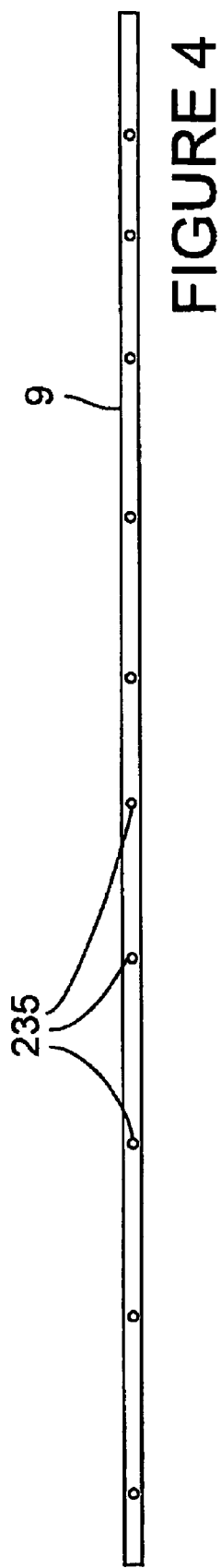
FIG. 4 is a side view of the top panel of a housing of the apparatus of FIG. 1.

As illustrated in FIG. 3, a second side wall or panel 182 is substantially parallel to the first side wall 80. Like first side wall or panel 80, the second side wall 182 (also illustrated in FIG. 8) is joined to and extends perpendicular to the front panel 9 (also illustrated in FIG. 4) at an side of the front panel 9 laterally opposite the side of the front panel to which the first side wall 80 is joined. The second side wall 182 also includes the mounting contour 82, as does the first side wall 80.

The PDU 1 can also include the back or rear panel 188 (see FIGS. 3, 6 and 7) that is joined and extends perpendicular to the first side wall 80 and second sidewall 182.

Figure 15:
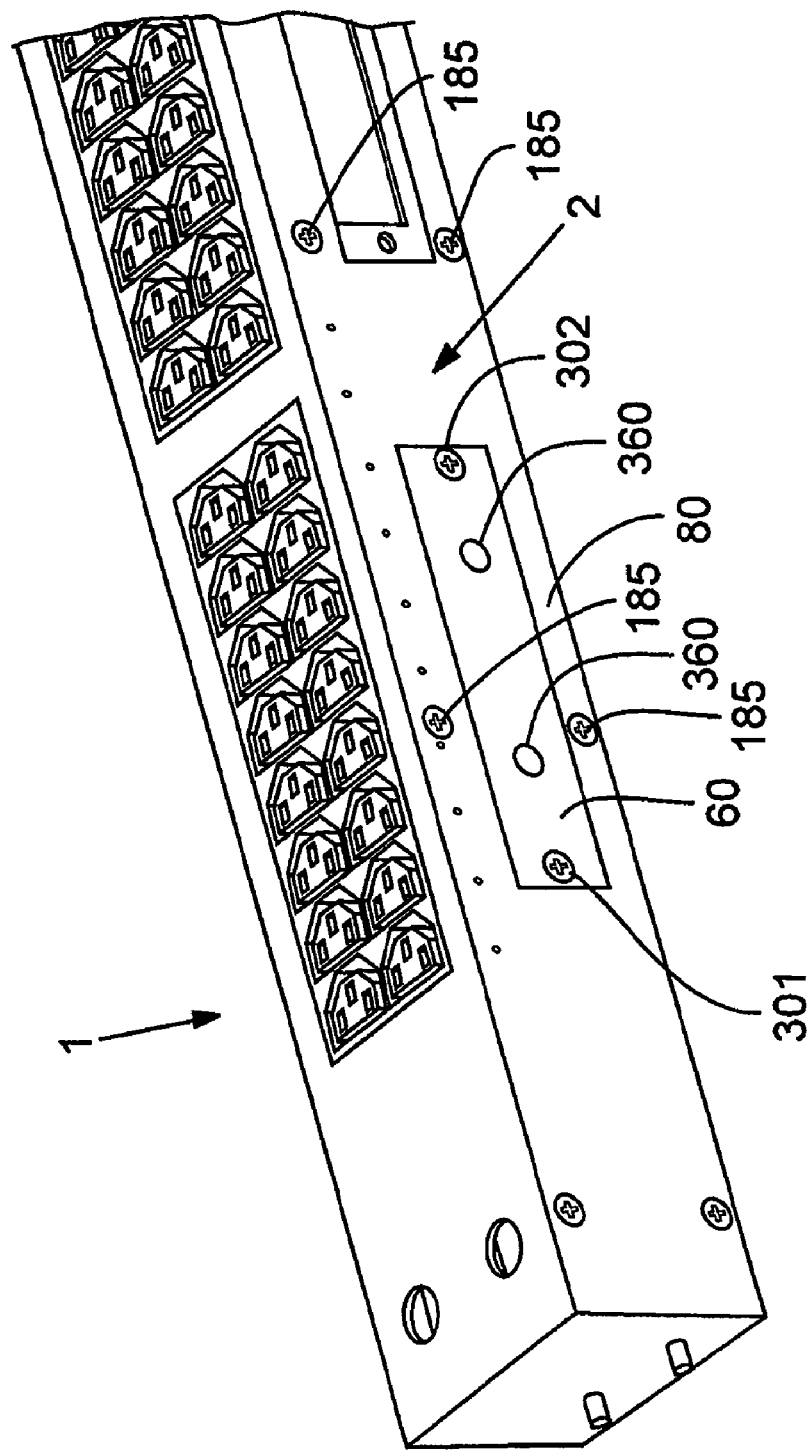
FIG. 15 is a perspective view of another embodiment of a fuse assembly associated with the apparatus of FIG. 1 and in which an element changes state to indicate a fuse condition.

In the illustrated embodiments, fasteners, such as fasteners 185, e.g. metal screws, as shown in FIG. 15, project through apertures formed in adjoining panels and walls to join the front panel 9, back panel 188 and the first and second side walls 80 and 182 to close the housing 2. In some implementations, an end mounting bracket 191 may be affixed to the longitudinally distal end of the housing 2 to facilitate mounting the PDU in a rack unit (see FIG. 1). The housing 2 may have rack mounting features that can facilitate mounting to rack rails in a horizontal unit. Alternatively, as in the present example, the housing 2 may have rack mounting features that can facilitate mounting to a wall in a vertical rack unit (further illustrated below in FIGS. 20-23) to provide for convenient location with respect to power cords of rack mounted equipment and to avoid taking up vertical space within the confines of rack rails.

In some implementations, the rack mounting features can include the rack mating section 81 of the housing 2, which is formed in a portion of the back panel 188. As described above, the rack mating section 81 includes a mounting contour channel 82 defined by a central indented surface 194 and first and second central transverse surfaces 196, 198. The central indented surface 194 is disposed intermediate the first and second rear surfaces 206, 208 and extends generally parallel to the rear surfaces. The first central transverse surface 196 extends generally perpendicular to the central indented surface 194 and first rear surface 206 and is disposed intermediate the first rear surface and the central indented surface. The second central transverse surface 198 extends generally perpendicular to the central indented surface 194 and second rear surface 208 and is disposed intermediate the second rear surface and the central indented surface. Upper and lower ends, i.e., longitudinally distal and proximal opposite ends, of the housing 2 are closed respectively by first and second outer transverse surfaces 202 and 204 included in the back panel 188. The first central and outer transverse surfaces 196, 202 are joined by the first rear surface 206. Second central and outer transverse surfaces 198, 204 are joined by the second rear surface 208.

For rack mounting purposes, first and second longitudinally extending locator pins 210, 211 extend longitudinally from the first central transverse surface 196. The first and second locator pins 210, 211 operate in conjunction with the mounting section 81 to operate as a detent. Third and fourth locator pins 213, 214 extend longitudinally from second outer transverse surface 204. The locator pins 210, 211, 213, 214 may function to constrain the PDU 1 in a position within a rack as will be described below in more detail with reference to FIGS. 20-22.

Figure 5:
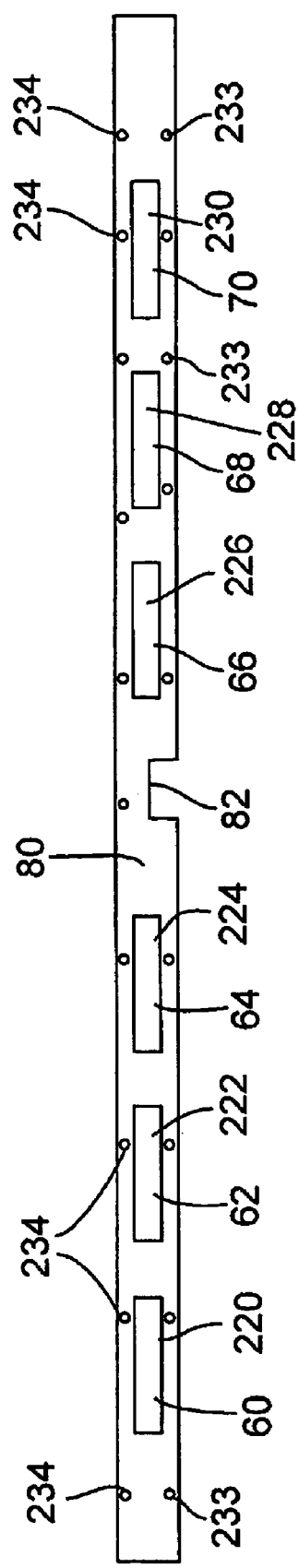
FIG. 5 is an elevational view of a side wall of the housing of the apparatus of FIG. 1 including fuse state indicators.

As shown in FIG. 5, the first side wall 80 includes first through sixth rectangular apertures 220, 222, 224, 226, 228, 230, which receive the first through sixth windows 60, 62, 64, 66, 68, 70, respectively. The windows 60-70 may be retained in any one of a number of manners, examples of which are described below. The first side panel 80 preferably has apertures 234 through which threaded fasteners, such as fasteners 185, may extend to thread into mating passages 235 (FIG. 4) in laterally disposed surfaces of the front panel 9 and the back or rear panel 188 to secure the first side panel to the front and back panels.

As shown in side view in FIG. 6, the back panel 188 includes first and second flanges 235, 236 extending perpendicularly from the first and second rear surfaces 206, 208, respectively, of the back panel. Similar flanges (not shown) extend perpendicularly from the first and second rear surfaces 206, 208, respectively, of the back panel at edges of the back panel that are transversely opposite the edges from which the first and second flanges 235, 236 extend. The flanges of the back panel, including the first and second flanges 235, 236, preferably include threaded apertures 237 in registration with the apertures 233 (FIG. 5) to receive fasteners, such as fasteners 185. Other well-known means may be used for receiving fasteners such as self-fitting nuts. The second side panel 182 (FIG. 8) may be secured to the back panel 188 in the same manner.

In an exemplary embodiment, the end mounting bracket 191 has first and second legs 241, 242 which are preferably perpendicular to each other. The first leg 241 is mounted to the first outer transverse surfaces 202 of the back panel 188 by fasteners 245. The second leg 242 has an aperture 246 (See FIG. 7) which may receive a fastener 247 for mounting in a rack unit.

Figure 9:
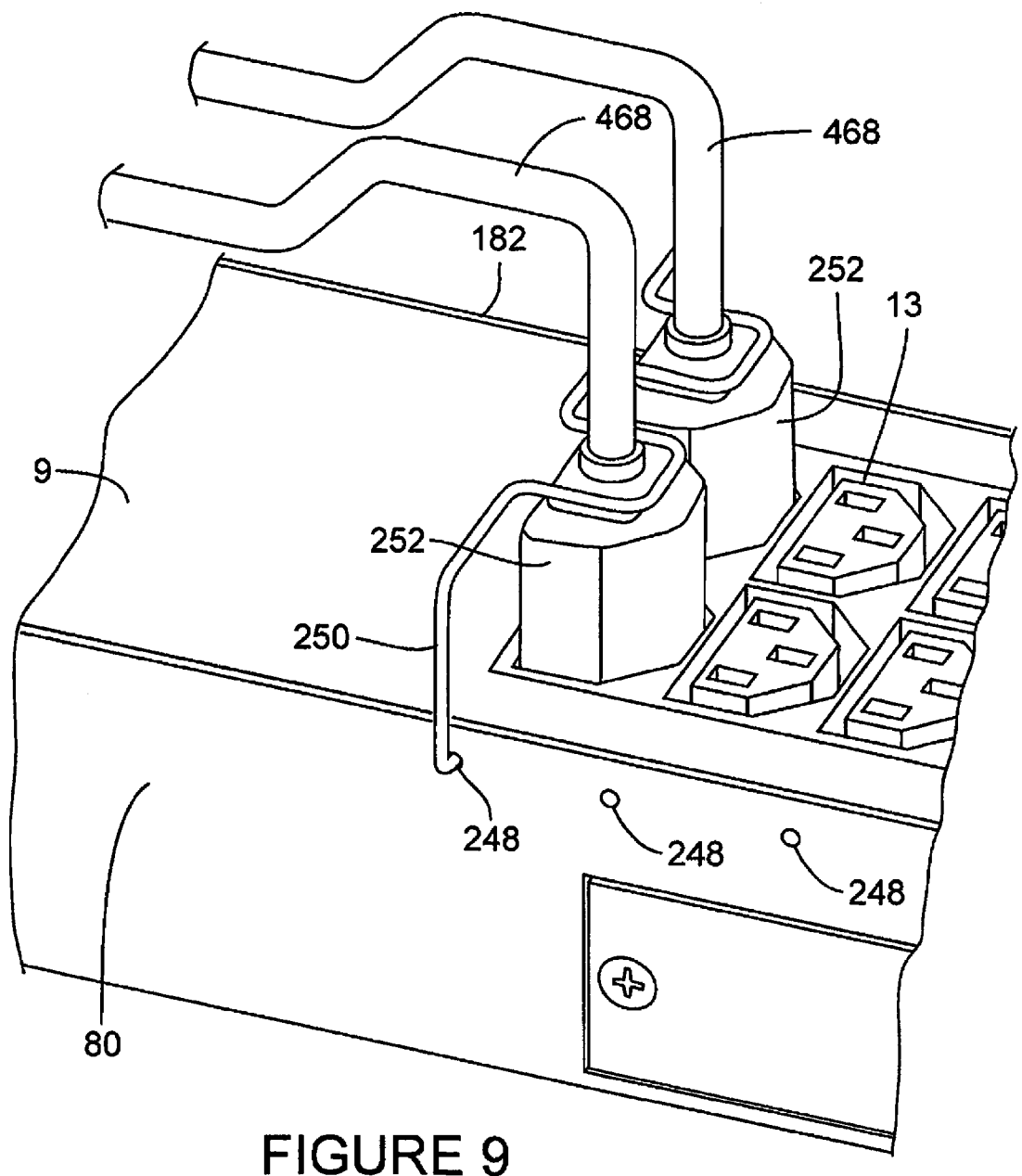
FIG. 9 is a partial detailed axonometric view of an embodiment including a device for holding power plugs in engagement with the apparatus of FIG. 1.

As shown in FIG. 9, according to one exemplary embodiment, additional apertures 248 may penetrate the first and second side walls 80, 182, respectively, at a forward side of the side walls to receive opposite ends of a plug retainer 250 configured to hold AC plugs 252 in engagement with receptacles 13. In the illustrated embodiments, plug retainer 250 is a wire with sufficient stiffness to hold a plug 252 in place when opposite ends of the retainer are secured in one aperture 248 in the first side wall 80 and a second aperture (not shown) in the second side wall 182. The wire should have sufficient flexibility to respond to manual force to be pushed onto or off of an end of the plug 252 remote from the front panel 9 and provide a press fit.

With reference now to FIGS. 10 and 11, the first window 60 is exemplary of the first through sixth windows 60-70. Fuses 131 and 132 are located longitudinally side by side and laterally adjacent the first window 60 within the interior confines of the housing 2. Each of the first and second fuses 131, 132 is connected between one of the pairs of first and second fuse mount terminals 123, 124. Each pair of first and second fuse mount terminals 123, 124 is electrically connected to one of the phase input lines 120.

A volume or space within the housing 2 in which the fuses 131, 132 are disposed when coupled to the first and second fuse mount terminals 123, 124 is referred to herein as a fuse compartment 137. Fuse compartments, e.g., fuse compartment 137, can be in registration, or aligned, with the first through sixth windows 60-70 respectively. In the present embodiment, the exemplary fuse compartment 137 is accessible by removal of a window, e.g., window 60, without disassembly of the housing 2. The fuse compartments of the PDU 1 may be segregated from other areas within the housing 1. For example, in some implementations, the housing can include walls (not shown) that isolate the fuse compartment from the remainder of the interior volume of the housing 2. Therefore, a manufacturer could permit a user to open up only that portion of the PDU 1 necessary to reach one of the fuses, e.g., 131, 132, while not having to void a warranty for opening up the rest of the housing 2. Specific examples of means of fastening the windows 60-70 are illustrated below.

The pairs of first and second fuse mount terminals 123, 124 and first and second fuses 131, 132 are mounted to a circuit board, such as circuit board 304. The PDU 1 can include first through sixth circuit boards, e.g., circuit board 304, each disposed within a respective fuse compartment, e.g., fuse compartment 137.

The housing 2 may be constructed so that the windows 60-70 are removable with simple hand tools. The windows 60-70, including the respective apertures 220-230 to which the windows are mounted, may be dimensioned for easy access to fuses such as the first and second fuses 131, 132. Easy access may comprise access by fingers of a user or by hand tools.

As described above, the fuses, such as fuses 131, 132, are visible through the windows, such as window 60, which are mounted to the housing. Window 60 is received and mounted in aperture 220. The aperture 220 can be recessed so that the window 60 is substantially flush with the first side panel 80. The first window 60 is retained to the first side wall 80 and within the aperture 220 by first and second fasteners 301, 302, which may comprise screws.

In some embodiments, as shown in FIGS. 10 and 11, the circuit board 304 is mounted to the window 60 for convenience. For example, at each corner of the circuit board 304 one of first though fourth standoffs 307, 308, 309, 310 maintain the circuit board 304 at a preselected transverse displacement from the window 60. First through fourth standoff fasteners 311, 312, 313, 314 pass through the window 60 and respective standoffs 307, 308, 309, 310 and are retained in the circuit board 304. In other embodiments, the circuit board 304 could be mounted to the housing 2 if desired.

Figure 13:
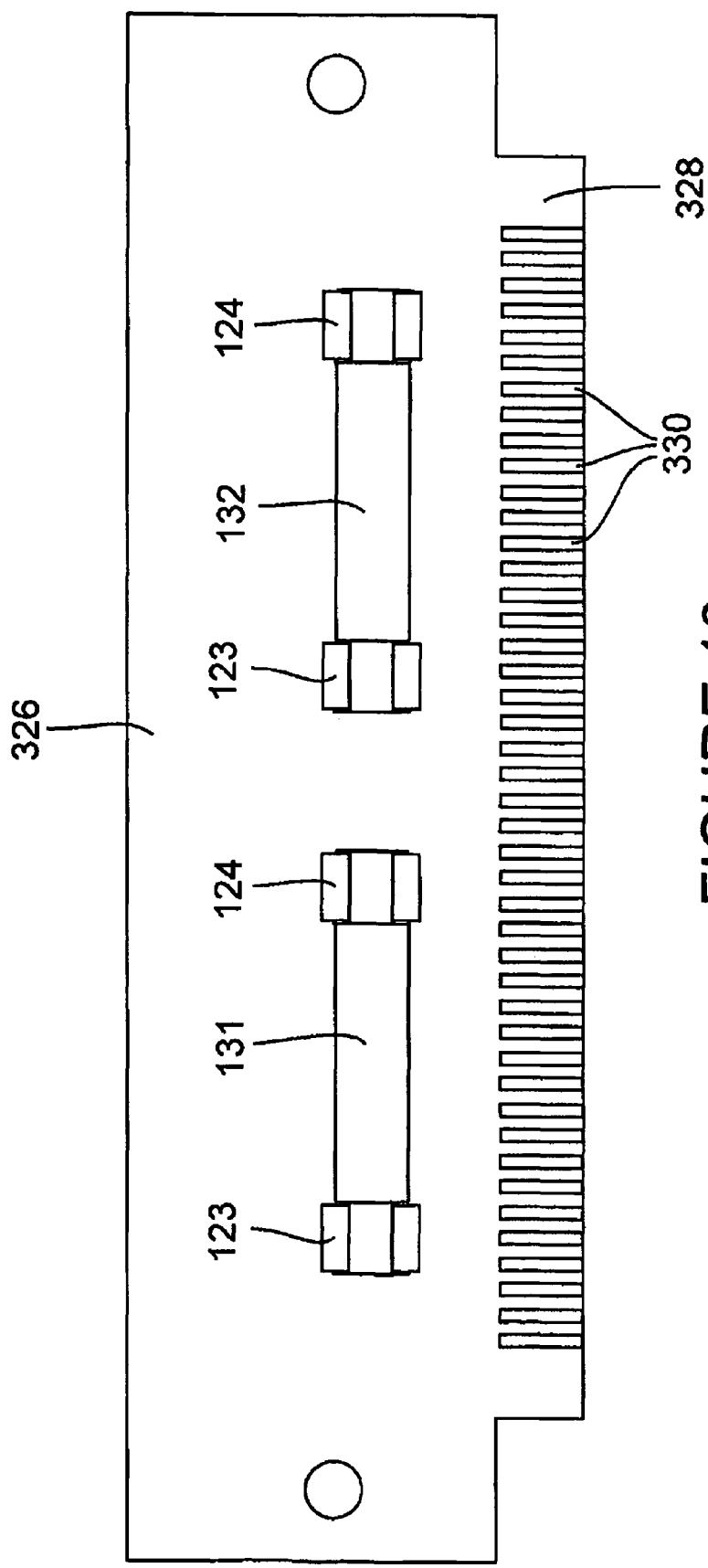
FIG. 13 is an elevational view of a removable fuse card of the fuse assembly shown in FIG. 12.
Figure 14:
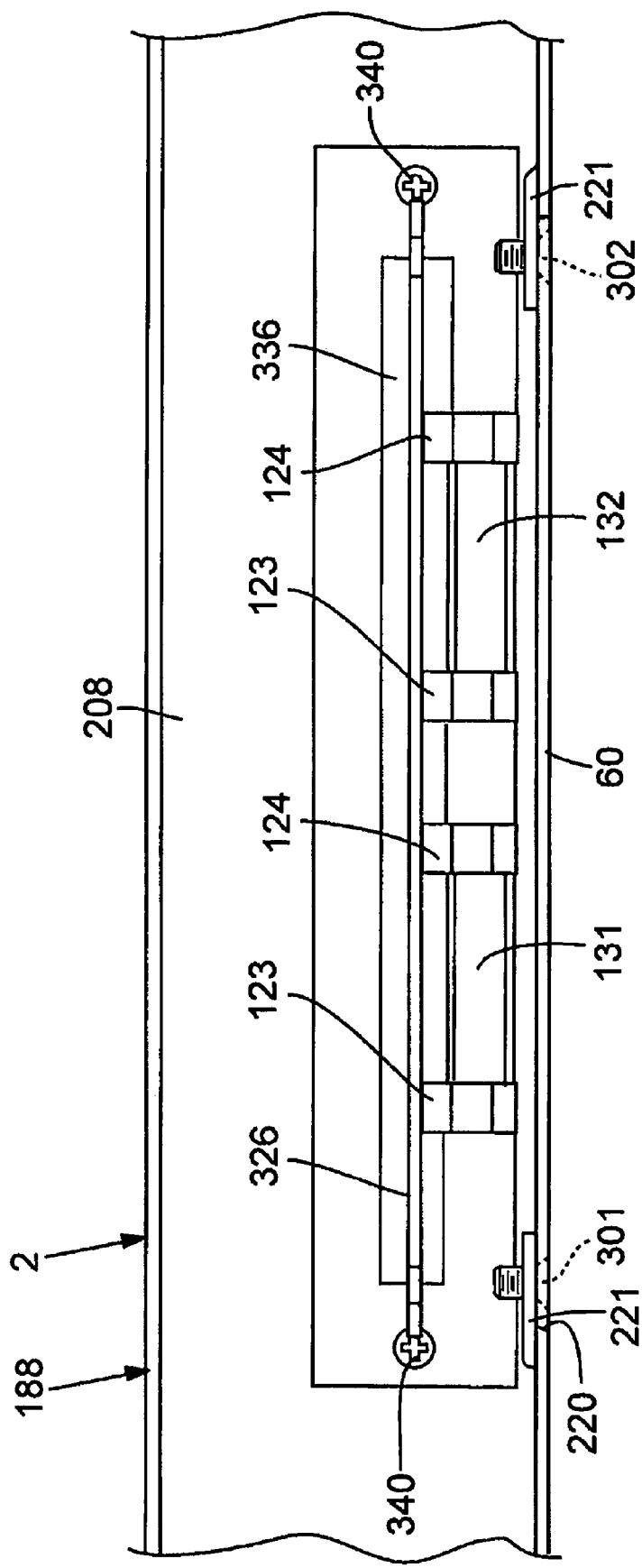
FIG. 14 is a plan view of the removable fuse card of FIG. 13 mounted within the housing shown in FIG. 12 with the front panel removed.

Referring now to FIGS. 12-14, an alternative embodiment of a PDU having housing 2 is shown. As perhaps best shown in FIG. 12, in some embodiments, the window receiving apertures, such as aperture 220, can include a recessed or stepped portion 221 to facilitate mounting of a window within the aperture 220 such that the window is substantially flush with an outer surface of the housing 2, which in this embodiment is the outer surface of a flanged portion 79 of the back panel 188.

As perhaps best shown in FIG. 13, in one specific embodiment, the printed circuit board can be a fuse card 326 that includes a tab 328 having copper tab terminals 330. The pairs of first and second fuse mounting terminals 123, 124 coupled to each fuse 131, 132 are each coupled to ut least one of the tab terminals 330 of fuse card 326. Referring to FIG. 14, the tab 328 is received in a conventional card connector 336 providing mechanical support for the fuse card 326 and providing the series connection of each of the fuses 131, 132 in one of the lines 120 (not shown). The tab terminals 330 and card connector 336 are wired in a well-known manner to provide the above-described series connections of the fuses 131, 132 in series between the first supply terminal block 101 (FIG. 2) and the first and second receptacle banks 10, 12 respectively. The card connector 336 is supported directly or indirectly to the housing 2. In the present example, for simplicity in illustration, the card connector 336 is supported to an inner side of the second rear surface 208 of the back panel 188 (FIG. 3) by fasteners 340. In some implementations, the connector 336 can be mounted to and supported by the front panel 9 (FIG. 1) or first side panel 80 (FIG. 1).

Referring to FIGS. 15-18, other embodiments of a fuse assembly having fuse state indicators are shown. A fuse state indicator is an indicator device whose state corresponds to whether a fuse is conductive or blown.

Figure 16:
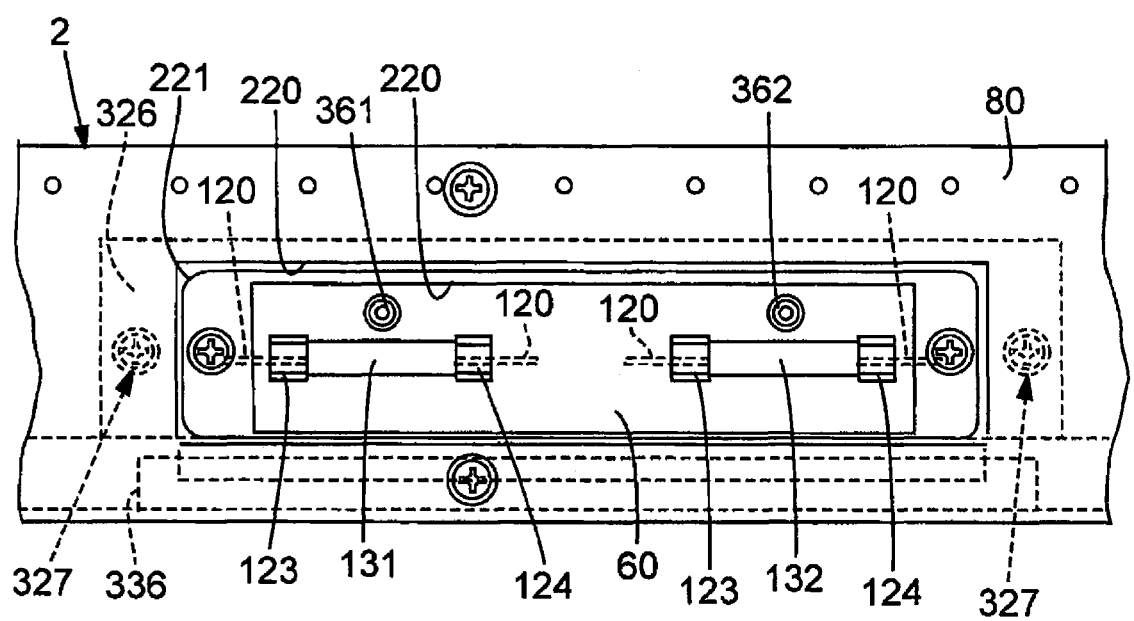
FIG. 16 is an elevational view of the fuse assembly embodiment shown in FIG. 15.

In the embodiment shown in FIGS. 15 and 16, the fuse state indicators each comprise light emitting diodes (LEDs) 361, 362 each electrically connected to one of the fuses 131, 132, respectively, and visible through the window 60. The window 60 is mounted to the side panel 80 of the housing 2 by fasteners 301, 302. The fuses 131, 132 are visible through the window 60 mounted within aperture 220 formed in the side panel 80. Similar to the embodiments described above in relation to FIGS. 12-13, the fuse assembly can include a fuse card 326 coupled to a card connector 336, both shown in hidden lines. The fuse card 326, or other type of printed circuit board, can also be coupled to the side panel 80 in spaced apart relation by a fastener/stand-off combination 327 also shown in hidden lines.

Figure 17:
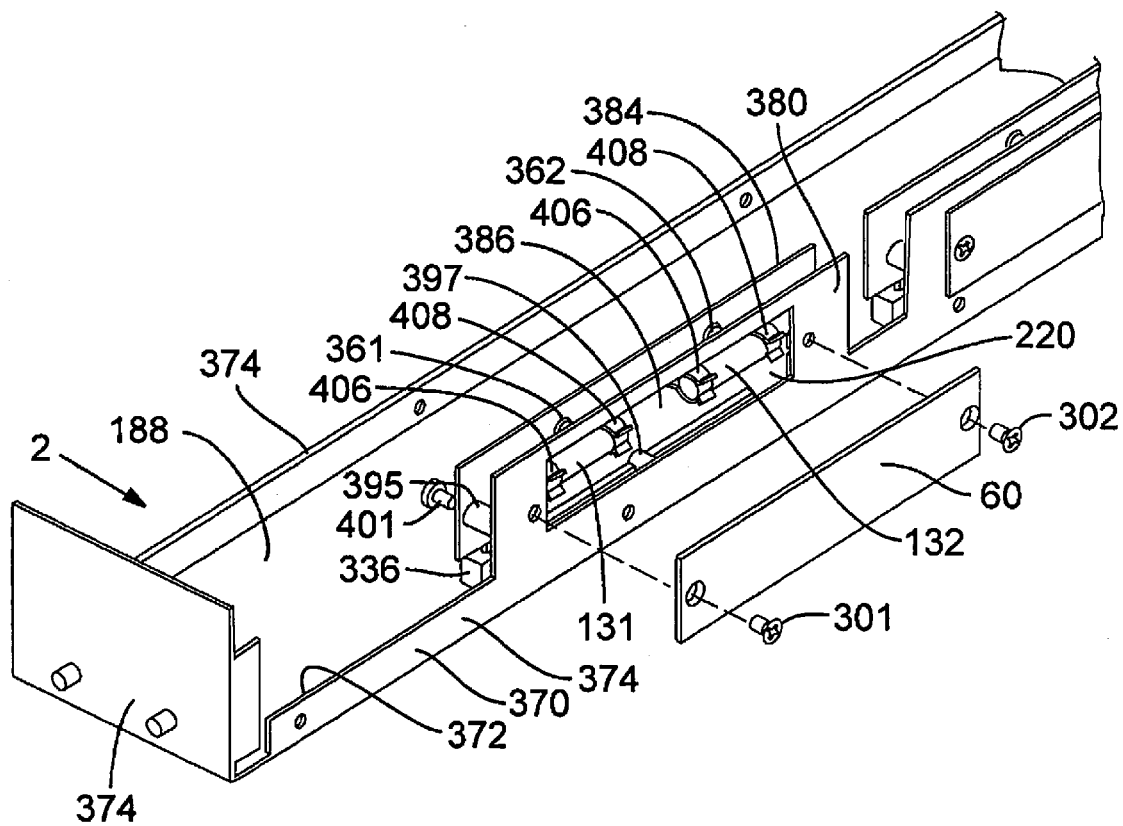
FIG. 17 is an exploded perspective view of another embodiment of a fuse assembly in which an element changes state to indicate fuse conditions.
Figure 18:
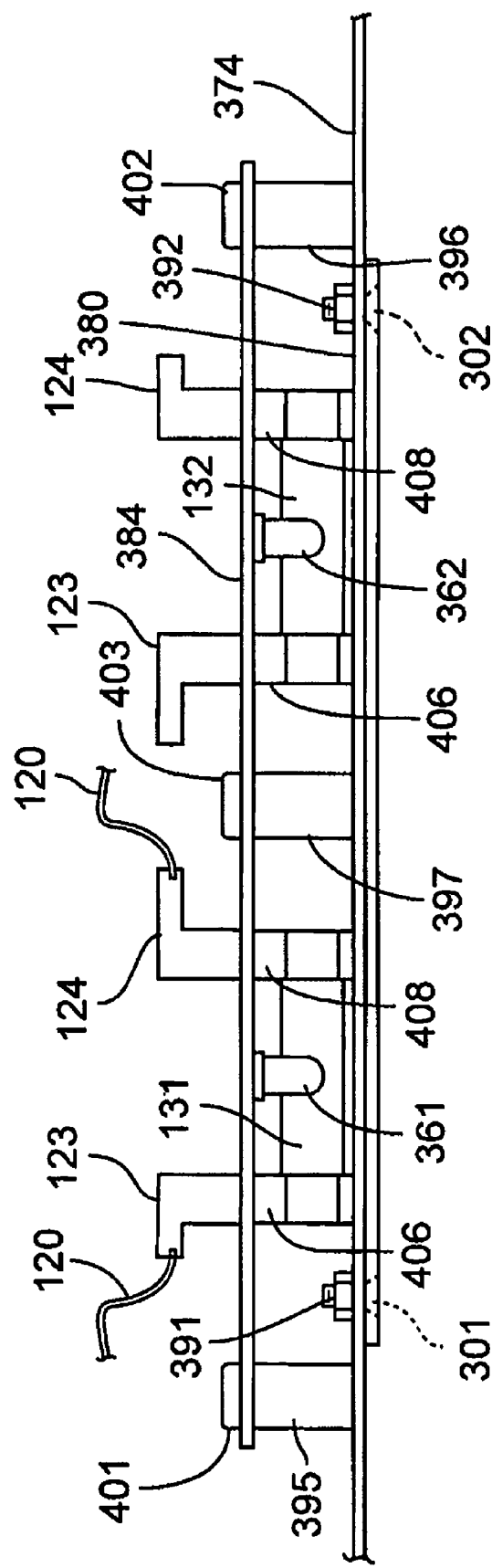
FIG. 18 is a plan view of the fuse assembly embodiment shown in FIG. 17.

Referring now to the embodiment shown in FIGS. 17 and 18, a fuse assembly is shown mounted to the back panel 188 of housing 2. The back panel 188 in this embodiment comprises an additional component, e.g., face plate 370, for mounting the window 60. The face plate 370 can be used irrespective of the type of fuse state indicator that is being employed. The face plate 370 has a back surface 372 in registration with the back panel 188 and flanges 374 that extend perpendicularly, i.e., transversely, from the lateral and longitudinal edges of the back panel. Additionally, a plurality of rectangular members, such as rectangular member 380, projects from the flange 374 and each include a respective fuse aperture, such as aperture 220. Each rectangular member may have a greater longitudinal extent than the apertures and windows of which they are associated. The window 60 may be fastened to the rectangular member 380 with fasteners 301, 302. A circuit board 384 may be separately fastened to the first rectangular member 380 of the face plate 370. The rectangular member 380 has a central cutout 386 so that fuses 131, 132 on the circuit board 384 are accessible therethrough for replacement.

With reference to FIG. 18, the fasteners 301, 302 are received in nuts 391, 392, which are on an opposite side of the face plate 374 from the window 60. Preferably, the nuts 391, 392 are adhered to the face plate 374. As shown, circuit board 384 is displaced from the faceplate 374 by first and second standoffs 395, 396 on opposite longitudinal sides of the window 60 (opposite left and right sides as viewed in FIGS. 17 and 18) and a third faceplate standoff 397 longitudinally intermediate the faceplate standoffs 395, 396 and laterally displaced therefrom. The faceplate standoffs 395, 396, 397 may be glued to the faceplate 374 or otherwise fastened thereto. First, second and third standoff screws 401, 402, 403 may secure the circuit board 384 to the standoffs 395, 396, 397, respectively. The fuses 131, 132 are respectively received in first and second fuse cartridge holders 406, 408, respectively. The first and second fuse cartridge holders 406, 408 extend through the circuit board 384 to connect to separate pairs of first and second terminal lugs, e.g., lugs 123, 124, which in turn are electrically coupled to power lines 120.

The indicator LEDs 361, 362 are mounted adjacent the fuses 131, 132 respectively. Each LED 361, 362 is in the OFF state when its corresponding fuse is blown and in the ON state when the fuse is conducting. In order to provide this operation, the indicator LEDs 361, 362 may be connected from the load side of the fuses 131, 132, respectively, to the source side of the fuses 132, 131, respectively, so as to be energized when the fuse is conducting and to be deenergized when the fuse comprises an open circuit. The LEDs 361, 362 are mounted in a conventional manner so the leads (not shown) extend from an opposite side of the circuit board 384 from which the LEDs 361, 362 are visible for connection to circuitry further described below. Other connections could be provided to achieve this operation. Indicator elements other than LEDs could also be used.

Figure 19:
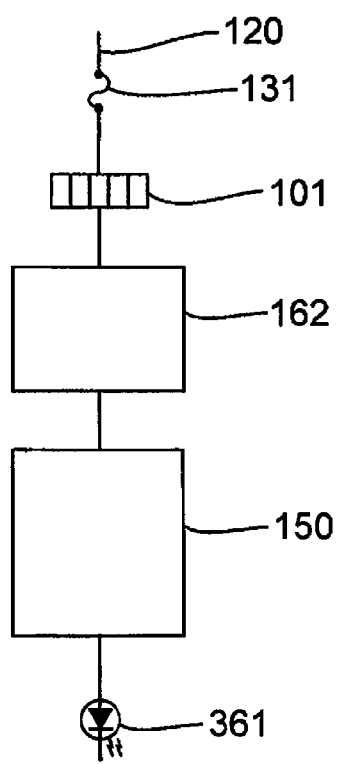
FIG. 19 is a schematic diagram of a fuse condition indication circuit that can be used in selected embodiments.

FIG. 19 is a schematic diagram of the fuse condition indication circuit that may be used in select embodiments. In FIG. 19, the same reference numerals are used to denote elements corresponding to those in FIG. 2. The fuses, e.g., fuse 131, is connected to the first bank supply terminal block 101. A voltage sensor module 162 is connected to the first bank supply terminal block 101 to sense continuity in the power line 120. This sensing of an open circuit is done in the same manner as in the above-cited Dual-Feed Power Tower XL system. In the present embodiment, the voltage sensor module 162 is used to sense whether each of the lines 120 including the fuse 131 are closed between the first and second outlet banks 10 or 12 (not shown) and the first bank supply terminal block 101. If the circuit is open, the voltage sensor module 162 provides a signal indicative thereof to the control circuit 150. The control circuit 150 sends an activation signal to illuminate the LED 361 if the fuse 131 is blown or an activation signal to the LED 362 if the fuse 132 is blown. Otherwise, the LEDs 361 and 362 remain off. The state of the LEDs 361 and 362 is visible through the window 60.

FIG. 20 is a perspective view of the electrical apparatus 1 of FIG. 1 mounted in a rack 430. FIG. 21 is a partial detailed view of FIG. 20. FIG. 22 is a partial detailed view FIG. 20 illustrating the electrical apparatus 1 as viewed in the rack apparatus when facing the back panel 188 of the housing 2. The same reference numerals are used to denote elements appearing, for example, in FIGS. 1-9.

With reference now to FIGS. 20-22, the rack 430 is RETMA rack having a front side 484, first and second opposite sides 436, 437 extending transversely from the front side, and a back side 440 parallel to and opposite the front side. Channel-shaped horizontally disposed first and second bracing members 445, 446 are located at a vertical midpoint of the first and second sides 436, 437, respectively, of the rack 430. The first and second bracing members 445, 446 preferably define vertical cross sections having a rectangular envelope. Preferably, the PDU 1 is vertically aligned with the rack 430. In other words, a longitudinal major dimension of the housing 2 of PDU 1 aligns with a vertical major dimension of the rack 430. The first and second bracing members 445, 446 have first and second horizontally extending support surfaces 438, 439, respectively, which may comprise flanges. The first and second support surfaces 438, 439 each have locating apertures 441 (see FIGS. 21 and 22). The locating apertures 441 may receive the locating pins 210, 211 (see FIG. 22).

A pair of opposing first front and back vertically extending rack rails 448 and a pair of opposing second front and back vertically extending rack rails 449 opposite the pair of first rack rails are located adjacent the sides 436, 437, respectively. In the present embodiment, the first and second vertically extending rack rails 448, 449 support the first and second horizontally disposed bracing members 445, 446 and are further secured to first and second upper housing members 452, 453. The first and second upper housing members 452, 453 are substantially parallel to the first and second bracing members 445, 446 and disposed at the upper vertical extent of the rack 430. The first and second vertically extending rack rails 448, 449 are also further secured to first and second lower housing members 454, 455, which are substantially parallel to the first and second bracing members 445, 446 and disposed at the lower vertical extent of the rack 430. The first and second lower housing members 454, 455 may each contain a surface having apertures for receiving the locator pins 213, 214 (not shown) extending from the longitudinally proximal end of the housing 2.

Figure 23:
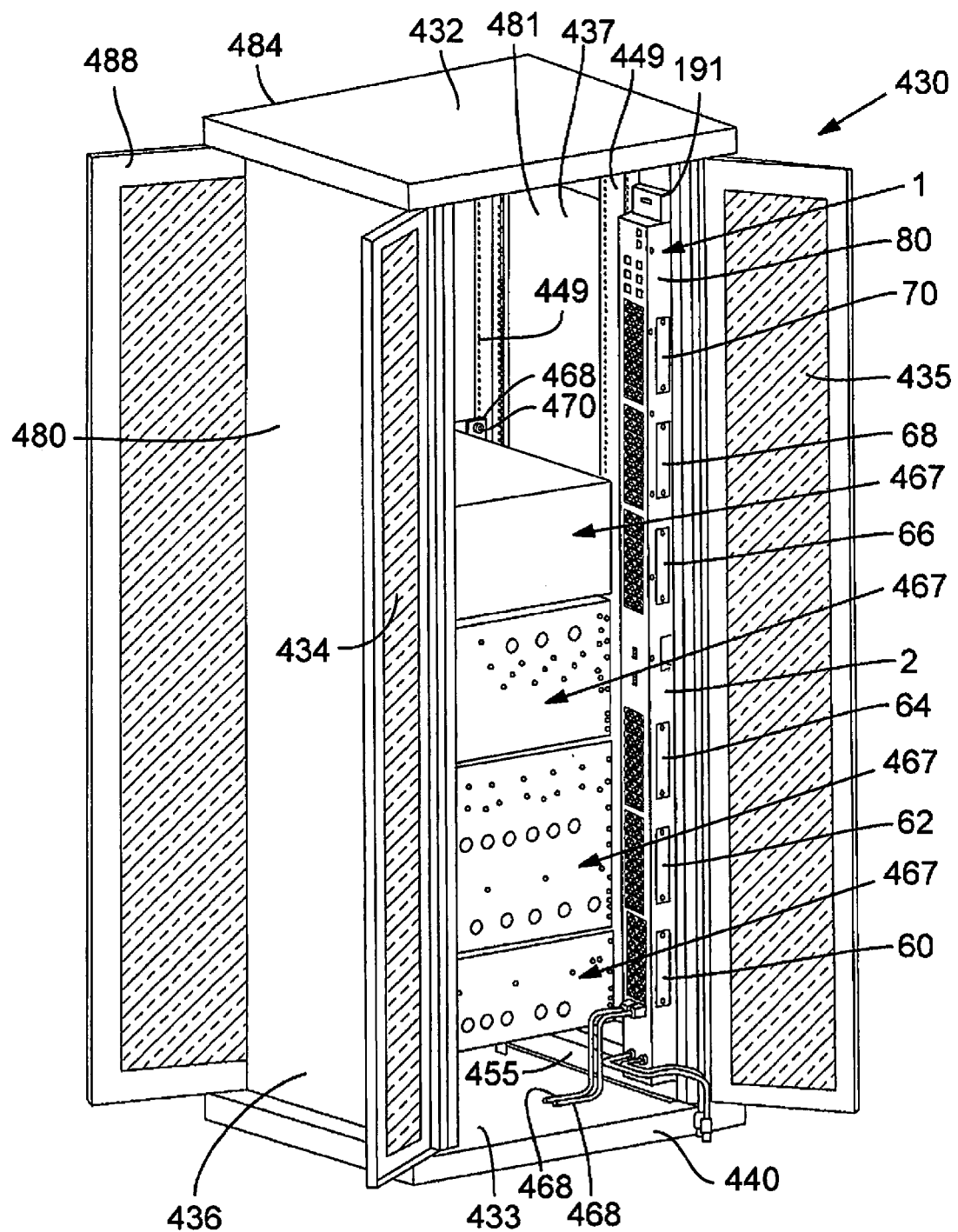
FIG. 23 is a perspective view of the apparatus of FIG. 1 mounted within the confines of an electronic equipment rack having doors providing access to the apparatus and other components mountable in the rack.

The rack 430 is a standard component, and the first and second vertically extending rails 448, 449 when mounted as described are spaced form each other to support standard size rack mounted equipment units 467 powered by power cords 468 (see FIGS. 9 and 23). The first and second rack rails 448, 449 also have fastener-receiving openings 464. Commonly, as shown in FIG. 23, rack mounted units 467 will have rack fastener passages 468, such as notches or apertures. Rack equipment fasteners 470, such as screws secured by nuts, extend through the passages 468 to secure the various rack mounted units 467 to the first and second rack rails 448, 449.

The rack fastener passages 468 are preferably spaced to accommodate standardized unit heights. Unit height is standardized in multiples, referred to as 1 U, 2 U, etc., of a standard height dimension U (1.75 inches).

In order to provide for convenient access for users of the rack 430 to plugs 252, the PDU 1 is placed between the first and second rack rails 448, 449 and the back side 440. In the present example, the housing 2 is vertically disposed with the back panel 188 facing the second side 437. As perhaps best shown in FIGS. 21 and 22, in order to better fit in the rack 430, the rack mating section 81 cooperates with the second bracing member 446. The second bracing member 446 fits in the contour 82 (FIG. 1) of the rack mating section 81. First and second locating pins 211 and 212 extending vertically downwardly from the first inner lateral surface 196 (FIG. 3) are received in apertures 441 to locate the housing 2 on the second bracing member 446 adjacent the back vertically extending rack rail 449. The second bracing member 446 provides vertical support to the housing 2. The pins 213, 214 at the second outer lateral surface 204 of the housing 2 (FIG. 3) are received in the apertures (not shown) of the second lower housing member 455. The second lower housing member 455 may also share weight applied in the vertical direction from the housing 2. It is possible to change the spacing of the surfaces of the second bracing member 446 and second lower housing member 455 to vary distribution of the weight of the housing 2.

Normally both the second bracing member 446 and second lower housing member 455 will provide support. Alternatively, or in addition, the end mounting bracket 191 (FIG. 1) may be secured to the second upper housing member 453 by the fastener 247 (FIG. 6).

The housing 2 is mounted so that the windows 60-70 remain visible from the rear or back of the rack. Therefore, the fuses 131-136 can always be inspected to determine each of their states. Since the windows 60-70 remain accessible, they can be removed without removing the housing 2 from the rack 430 and without disassembly of the housing 2. Therefore, any downtime due to the need to replace a fuse is minimized.

FIG. 23 is a perspective illustration similar to FIG. 20 in which the same reference numerals are used to denote corresponding components. However, the rack 430 shown in FIG. 23 has first and second side walls 480, 481 outside of vertically extending rails 448, 449, and first and second bracing members 445, 446. The rear front side 484 of the rack 430 may be closed by a first front door 488 and a corresponding second front door (not shown) pivotably mounted to sides 480 and 481, respectively, proximate the front of the rack. Similarly, a rear side 440 of the rack 430 may be closed by first and second rear doors 434, 435 pivotably mounted to sides 480, 481, respectively, proximate the rear of the rack. Further rack mounted equipment units 467 may be mounted to the first and second rack rails 448, 449 (FIG. 20). Power cords 468 may be conveniently plugged in the housing 2.

In accordance with the above teachings, fuses are provided in a readily accessible position. More specifically, the housing 2 of the PDU 1 is configured so that when it is mounted in an apparatus, such as an electrical equipment rack, the fuses can be accessed by removing just the covers, e.g., the windows 60, without having to remove the entire housing 2 from the apparatus. In the embodiments illustrated in FIGS. 20-23, the windows 60 are mounted in the side wall 80 (FIG. 1), and the housing 2 is mounted on the left side, or side 437, of rack 430 as seen in FIGS. 20 and 23. Alternatively, in some embodiments, the windows 60-70 could be included in side wall 182 illustrated in FIG. 3 and the housing 2 could be mounted on the right side, or side 436, of the rack 430. Windows 60-70 mounted in the side wall 182 would be unobstructed when the housing 2 is mounted on the left side of the rack 430. The housing 2 may be constructed in either configuration.

Fused circuitry may be isolated from the fuses themselves so that a user may be permitted to open a fuse compartment without having to open a circuit enclosure, which might void a warranty.

Further, the state of the fuses may be inspected without having to remove fuse covers or open a fuse compartment. For example, a fuse may be inspected through a transparent window. Alternatively, a fuse state indicator element may be provided having first and second states each corresponding to a conductive or nonconductive state of the fuse. Different fuse-carrying structures are provided, each of which allows for simplicity and convenience in replacing fuses. Fingers or simple hand tools may be used. Indicators are provided which may interact with existing intelligent power control circuitry.

Alternatively, circuit breakers (not shown) may be provided. Such circuit breakers could be mounted within the side wall 182 of the housing 2 so that they can be readily observed or reset by a user without opening the housing 2.

In the embodiment of FIG. 20, the housing 2 is readily mountable within the confines of a rack so that the fuse covers or windows are readily accessible. Consequently, down time resulting from inspecting or replacing fuses is minimized. When a communications server is down, saving even a few minutes in completing service is of great value to users. The construction of the detent allows a single service technician to have the PDU remain in place while fasteners are being inserted to secure the PDU to the rack.

Many modifications may be made in the specific teachings provided above to provide an electrical apparatus constructed in accordance with the above disclosure.

For example, described hereinafter are embodiments of a retractable or repositionable fuse module for use with a fused electrical apparatus. The retractable fuse module provides easy access to one or more fuses of the fused electronic apparatus. In some implementations, the fuse module can be manipulated by a user to reposition a fuse holding portion for easy access to one or more fuses coupled to the fuse holding portion.

Figure 24:
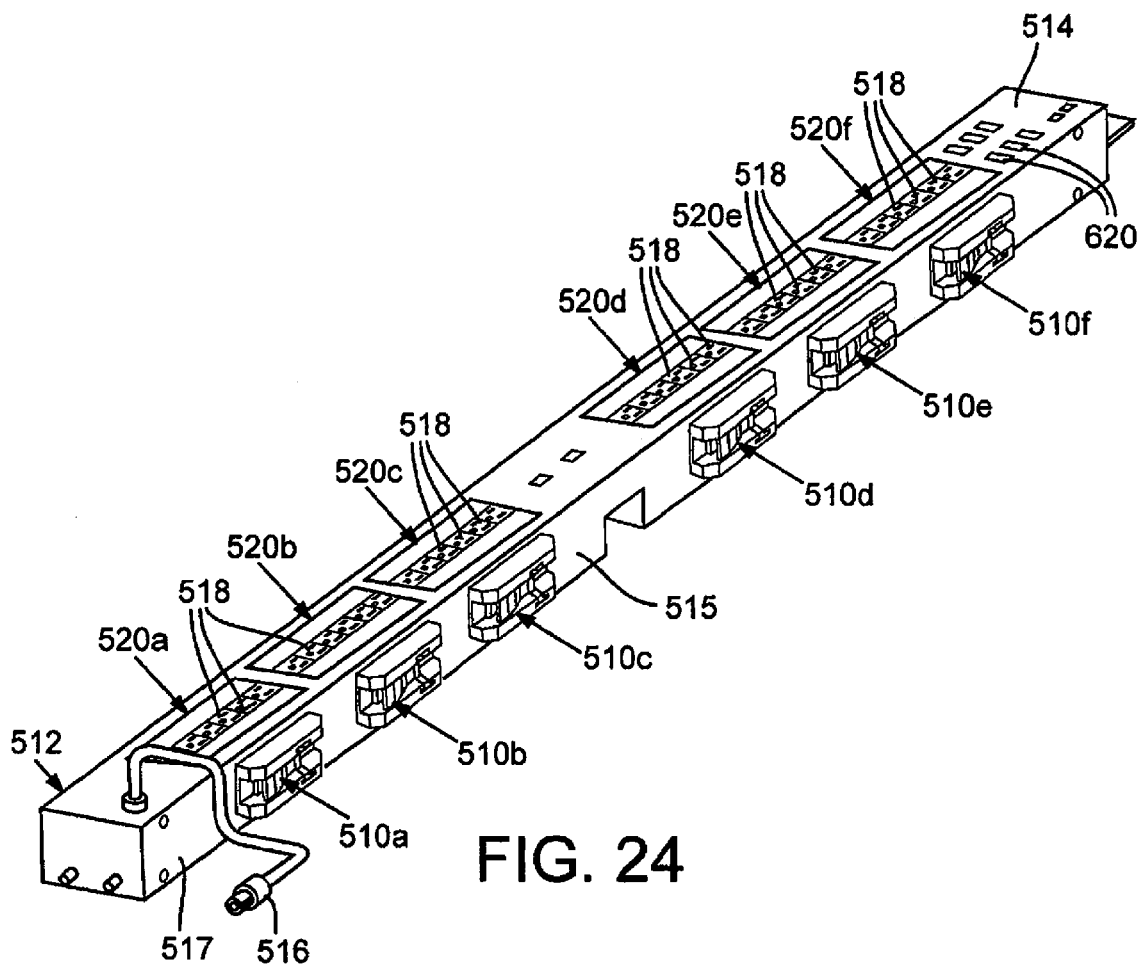
FIG. 24 is a perspective view of one embodiment of a power distribution unit having a plurality of fuse modules mounted to a housing of the power distribution unit.

Referring to FIG. 24, and according to one illustrative embodiment, a plurality of fuse modules having a repositionable or retractable portion, 510a, 510b, 510c, 510c1, 510e, 510f, is shown mounted to a power distribution unit 512. As sometimes used herein, the fuse modules can be termed repositionable, or retractable, fuse modules. The PDU 512 is similar to PDU 1 described above except that PDU 512 is adapted to receive a single power input, instead of two power inputs. Further, like PDU 1, PDU 512 has multiple columns of vertically arranged power receptacle banks. However, the receptacle bank columns of PDU 512 in this example are not horizontally or laterally adjacent each other as in PDU 1, but are rather only vertically aligned with each other.

PDU 512 can include a housing 514, a power input 516, which in this example is for a three-phase application, and a plurality of power receptacles, or outlets, 518. The plurality of receptacles 518 can be organized into first and second receptacle banks 520a, 520b, third and fourth receptacle banks 520c, 520d, and fifth and sixth receptacle banks 520e, 520f, each comprising a single column of multiple outlets 518 interconnected with each other. The first and second receptacle banks 520a, 520b can be electrically connectable to a first phase of the three phase power input 516, the third and fourth receptacle banks 520c, 520d can be electrically connectable to a second phase of the three phase power input, and the fifth and sixth receptacle banks 520e, 520f can be electrically connectable to a third phase of the three phase power input, such that each receptacle, or outlet, 518 provides single phase power to components plugged into the outlets.

Figure 33:
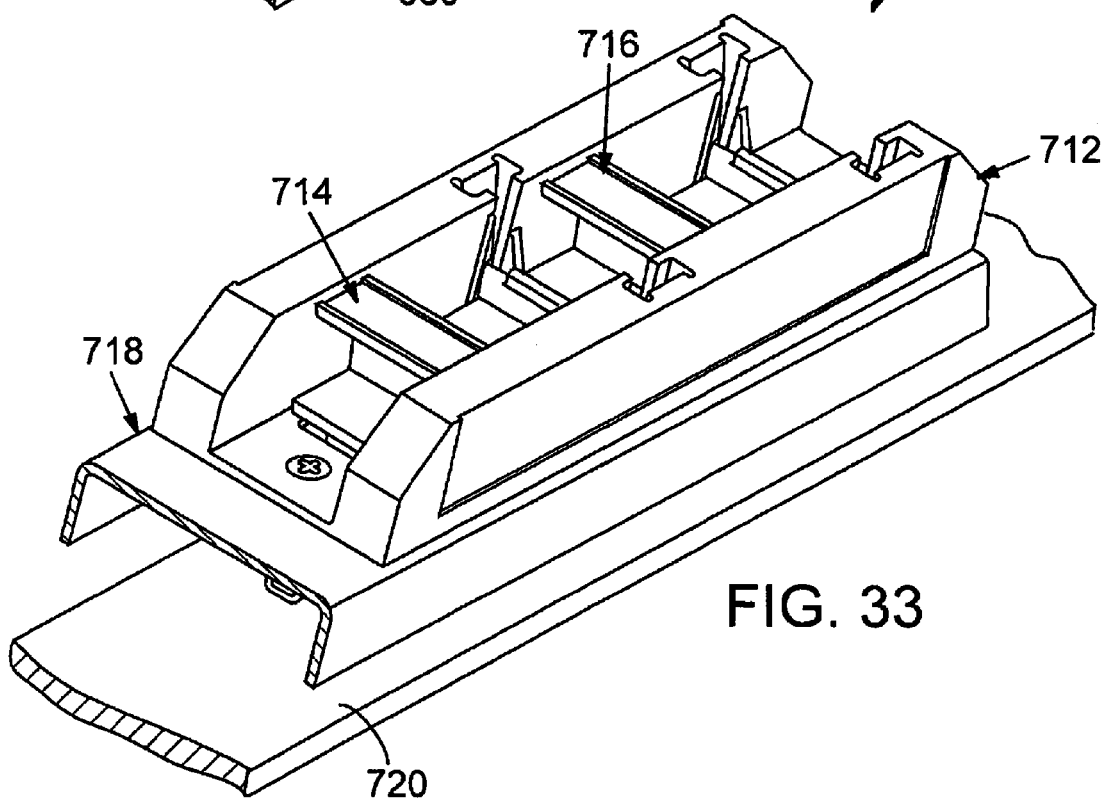
FIG. 33 is a perspective fragmentary view of one embodiment of a fuse module having two fuse holders.

Alternatively, as will be described below in relation to FIG. 33, in some embodiments, the retractable fuse module of the present application can be adapted to be mounted to and be operable with a PDU having two three-phase power inputs and sets of horizontally adjacent receptacle banks, such as PDU 1 described above.

In other embodiments, the power distribution unit can be adapted to receive one or more single-phase power inputs connected to a single-phase alternating current source (not shown) for providing single phase power to one or more outlet banks.

Figure 25:
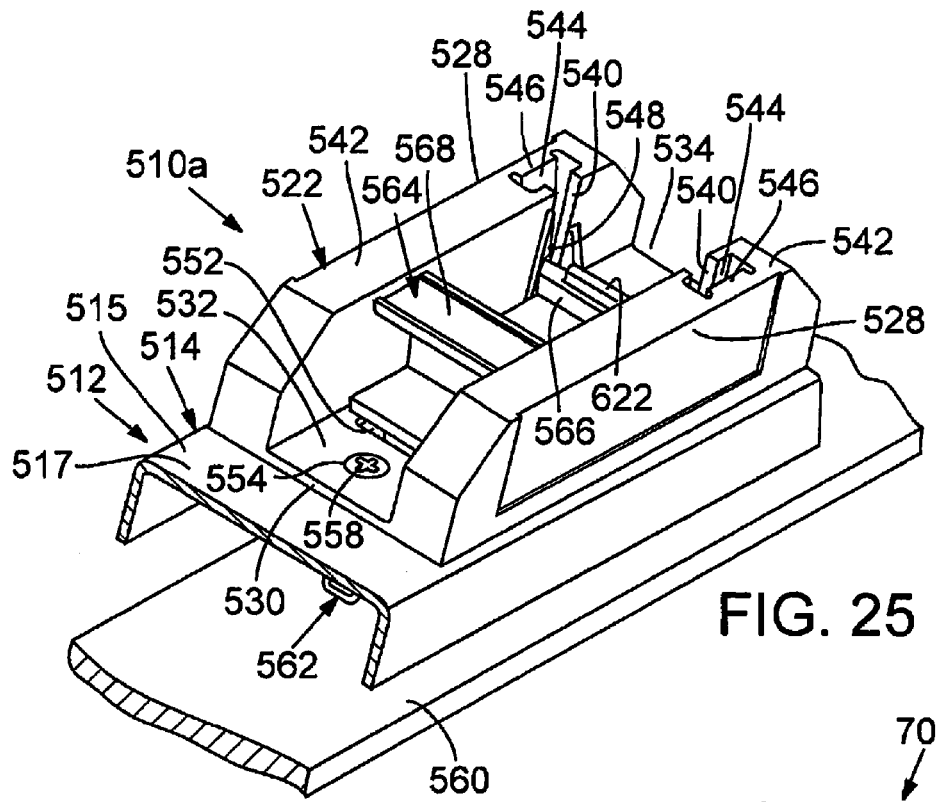
FIG. 25 is a perspective fragmentary view of one of the plurality of fuse modules shown in FIG. 1.

Referring now to FIG. 25, the fuse module 510a, being exemplary of fuse modules 510b, 510c, 510d, 510e, 510f, includes, for example, a base, or mount, 522 mounted to an external surface 515 of a sidewall 517 of the power distribution unit housing 514 and a retractable fuse holder, e.g., retractable fuse carrier 564. In the illustrated embodiments, the base 522 includes two opposing sidewalls 528 that extend longitudinally in relation to the housing 514 and transverse to the external surface 515 of the housing sidewall 517 when the base is mounted to the housing as shown in FIG. 25. The base 522 further includes a mounting wall 530 intermediate and coupling the sidewalls. The mounting wall 530 includes an inwardly directed surface (not shown) that is parallel to and coextensive with the external surface 515 of the housing sidewall 517 when mounted to the housing 514 and an outwardly directed surface, or carrier support surface, 532 opposite the inwardly directed surface. A fuse carrier receiving area 534 is defined between the mounting wall 530 and opposing sidewalls 528.

The base 522 also includes a pair of opposing slot portions 540 with one slot portion 540 formed in one base sidewall 528 and the other formed in the other base sidewall 528. As shown in FIG. 25, the slot portions 540 face each other. Each slot portion 540 extends generally transverse to the surface 515 of the housing sidewall 517 upon which the base 522 is mounted from an outer surface 542 of the sidewalls 528 of the base away from the housing 514 to the outwardly facing carrier support surface 532 of the base. The slot portions 540 include opposing resiliently flexible tabs 544 with each tab extending toward the opposing tab at a slight angle from fixed ends 546 at the outer surface 542 of the sidewalls 528 toward free ends 548 near the outwardly facing carrier support surface 532.

The length of the tabs 544 is such that the free ends 548 are located intermediate the outer surface of the base 522 and the carrier support surface 532 of the base. In other words, the length of the tabs 544 is such that a space is defined between the free ends 548 of the tabs and the carrier support surface 532.

Figure 31:
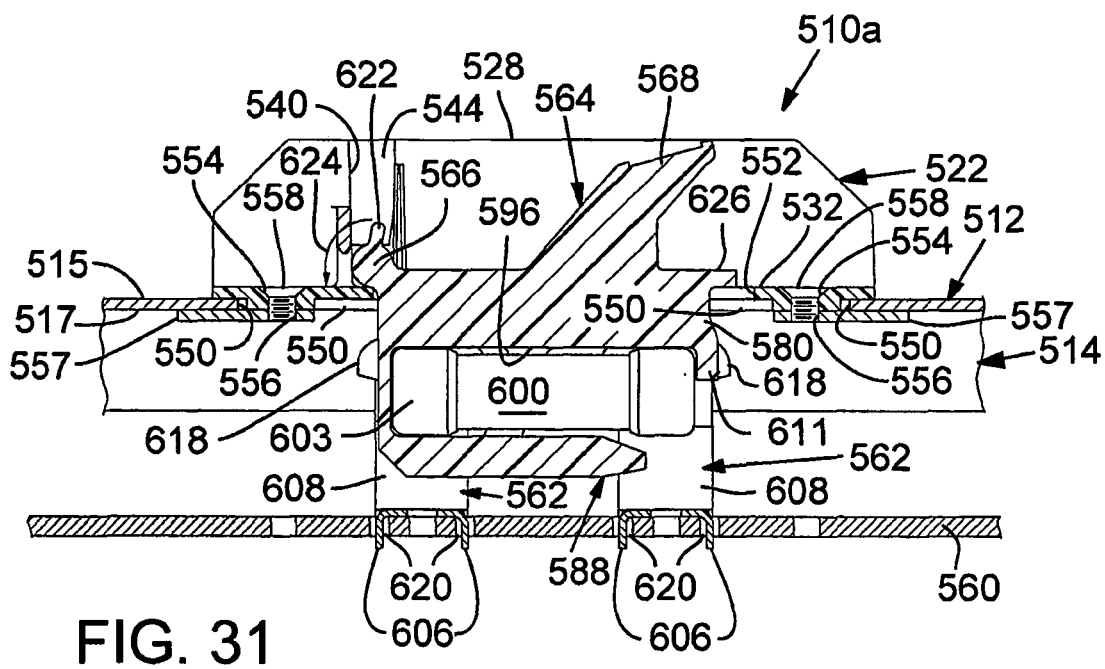
FIG. 31 is a cross-sectional side view of the fuse module of FIG. 25 but shown with the fuse holder in the closed position.
Figure 29:
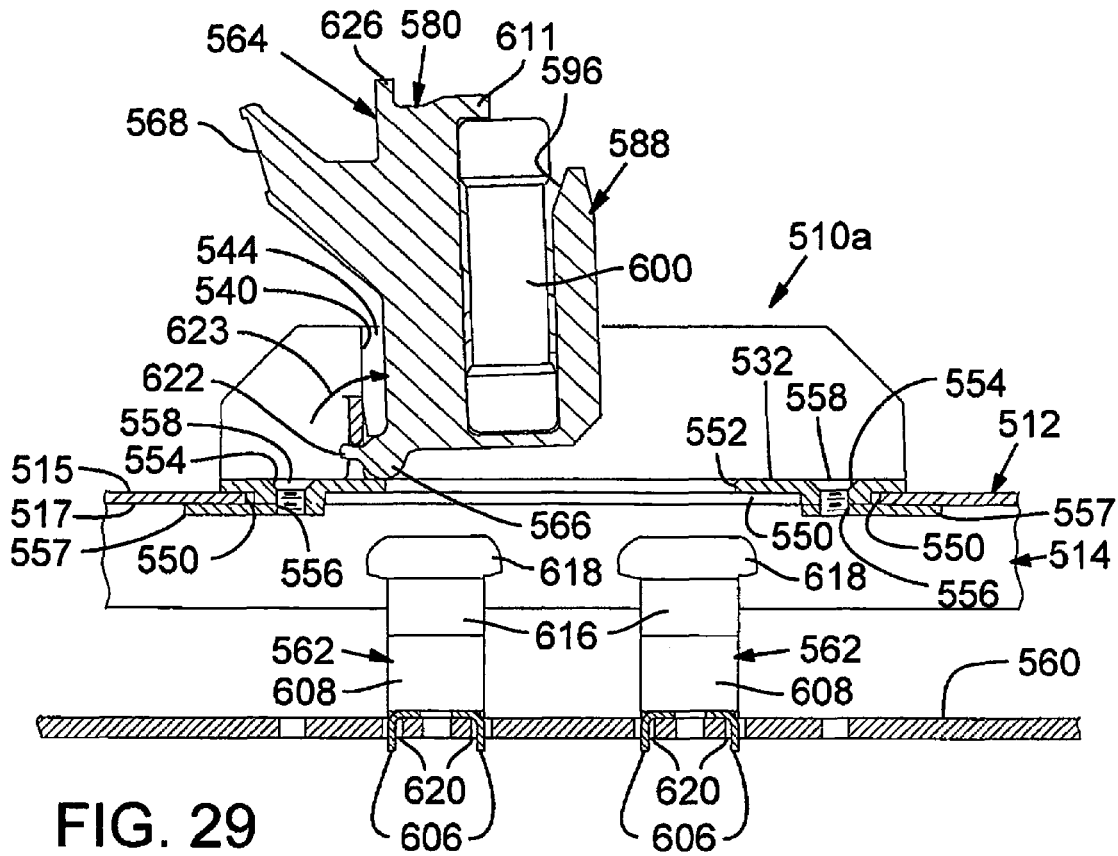
FIG. 29 is a cross-sectional side view of the fuse module of FIG. 25 but shown with the fuse holder in the open position.

Similar to the apertures, or passageways, 220-230 penetrating the first side wall 80 of PDU 1 described above, the power distribution unit housing 514 includes at least one fuse passageway 550 through which an interior of the housing can be accessed (see FIGS. 29 and 31). However, instead of receiving a transparent window as in embodiments shown in FIGS. 1-23, the at least one fuse passageway 550 receives a retractable fuse module, such as fuse module 10a. More specifically, the base 522 is mounted to the housing 512 substantially over the corresponding housing fuse passageway 550 such that the interior of the housing 514 can be accessed through the housing fuse passageway 550 and a base fuse passageway 552 penetrating the base 522.

In some implementations, mounting apertures 554 penetrate the base 522 and correspond to and align with apertures 556 (see FIG. 29) formed in tabs 557 fixed to the housing 514. A fastener, such as a screw 558, can be inserted through the mounting apertures 554 and tab apertures 556 and tightened to secure the base 522 to the housing 514.

In the illustrated embodiments, each housing fuse passageway 550 corresponds to one or more outlet banks, such as outlet bank 520a, mounted to the housing. Each passageway 550 penetrates a side of the housing 514 adjacent the corresponding outlet bank or banks. In this way, each base of the retractable fuse modules 10a, 10b, 10c, 10d, 10e, 10f corresponds to one of the respective outlet banks 20a, 20b, 20c, 20d, 20e, 20f.

The power distribution unit 512 can include a plurality of printed circuit boards, with printed circuit board 560 being exemplary of such boards, mounted to and disposed within the housing 514. Each printed circuit board is associated with at least one adjacent outlet bank. For example, printed circuit board 560 is associated with outlet bank 520a. The printed circuit board 560 is electrically coupled to the power input 516 via one or more power input connections (not shown) disposed on the printed circuit board and to each outlet bank of the corresponding pair of adjacent outlet banks 520a via respective power output connections (not shown) disposed on the printed circuit board. The power input and output connections are electrically couplable via circuitry formed on or in the printed circuit board 560.

The retractable fuse module 510a can include, for example, a pair of fuse terminals, or clips, 562 mounted to the printed circuit board 560, such as by soldering or through use of mounting structures available or known in the art.

As shown in FIG. 25, in one exemplary implementation, fuse carrier 564 includes a generally cylindrical portion 566 and a user engaging portion 568.

Figure 26:
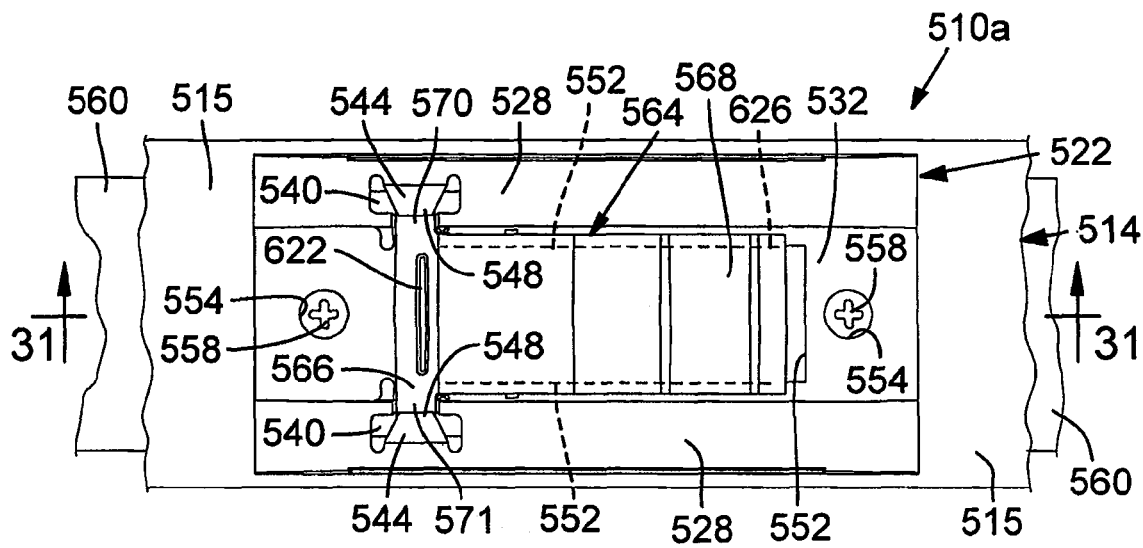
FIG. 26 is a top fragmentary view of the fuse module of FIG. 25.

The pair of slot portions 540 receives end portions 570, 571 of the cylindrical portion 566 of the fuse carrier 564. As perhaps best shown in FIG. 26, in specific implementations, each end portion 570, 571 of the cylindrical portion 566 at least partially extends into a respective opposing slot portion 540 and is retained within the slot portion by the resiliently flexible tabs 544 formed in each slot portion. The space defined between the free ends 548 of the tabs 544 and the carrier support surface 532 is larger than a maximum diameter of the end portions 570, 571 of the cylindrical portion 566. Further, the sidewalls 528 and slot portions 540 are spaced apart from each other such that the distance between the fixed ends 546 of the opposing tabs 544 is slightly longer than the length of the carrier cylindrical portion 566 and the distance from the free ends 548 of opposing tabs is shorter than the length of the carrier cylindrical portion 566 when the tabs are in an un-flexed state.

The fuse carrier 564 is retractable or repositionable relative to the base 522 and the housing 514 to which the base is mounted. For example, as perhaps best shown in FIGS. 29 and 31, the fuse carrier 564 is movably attached to the base 522, such as by pivoting. In this example, the fuse carrier 564 is movable attached to the base 522 by inserting the end portions 570, 571 of the cylindrical portion 566 into the opposing slot portions 540 proximate the outer surface 542 of the base. The fuse carrier 564 can then be moved inwardly toward the carrier support surface 532 of the base 522, such as by sliding the end portions 570, 571 within the slot portions 540. As the fuse carrier 564 is moved, the end portions 570, 571 of the fuse carrier contact and urge respective opposing tabs 544 to flex or move away from each other. The tabs 544 continue to flex until the end portions 570, 571 of the cylindrical portion 566 move beyond the free ends 548 of the tabs 544, at which time the resiliently flexible tabs return to an un-flexed state. With the tabs 544 in the un-flexed state, the end portions 570, 571 of the cylindrical portion 566 are disposed between and captured within the free ends 548 of the tabs and the carrier support surface 532 of the base 522, and the end portions of the cylindrical portion are allowed to rotate within the space. In this manner, the fuse carrier 564 can be movably retained within the fuse carrier receiving area 534 of the base 522.

In other embodiments, the fuse carrier can be attached to the base by other known connecting mechanisms that allow movement of the carrier relative to the base, such as by a pin extending through an axial passageway in the cylindrical portion of the carrier and engaging corresponding holes in the base (see FIG. 34), a hinged connection, or other mechanism or mechanisms commonly known in the art.

Figure 27:
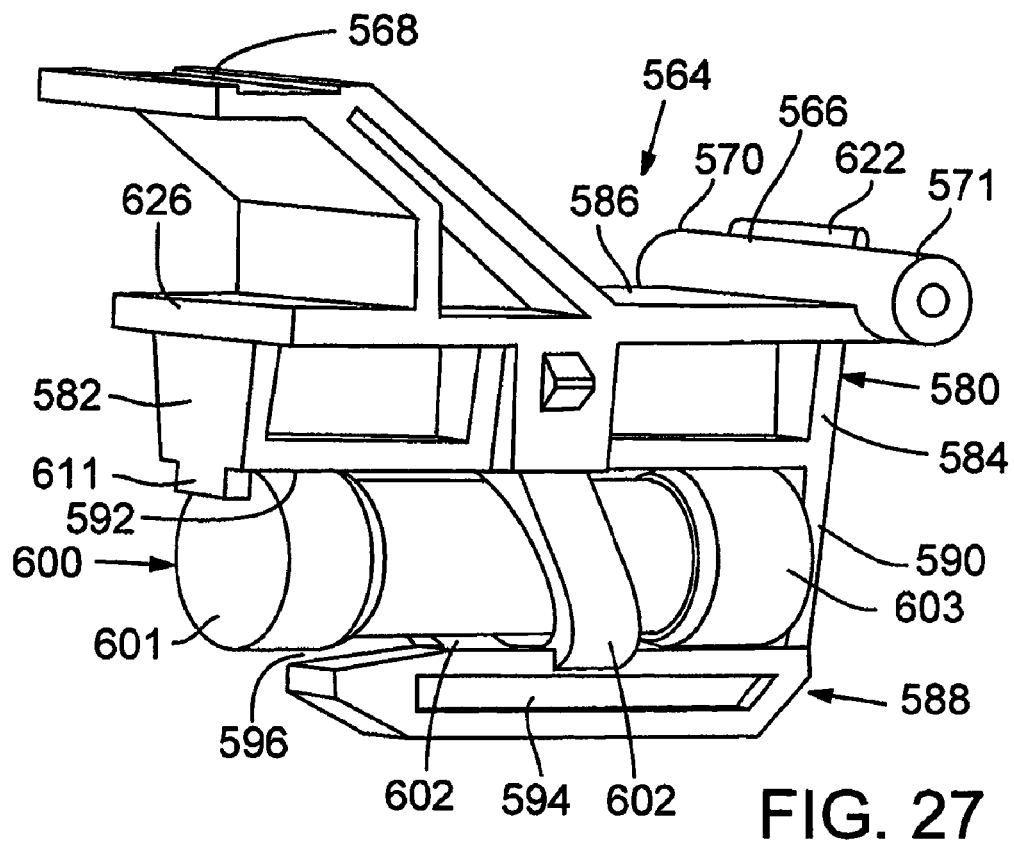
FIG. 27 is a perspective view of an exemplary fuse holder associated with the fuse module of FIG. 25.

Referring to FIG. 27, and according to one exemplary embodiment, fuse carrier 564 includes a body 580 having a first end 582 and a second end 584. The user engaging portion 568 extends from the body 580 at a location on an outwardly facing surface 586 of the body intermediate the first and second ends 582, 584 and in a direction from the second end 584 toward the first end 582. The fuse carrier 564 also includes a fuse support arm 588 having a first portion 590 that extends generally transversely from an inwardly facing surface 592 of the body 580, opposite the outwardly facing surface 586 of the body, at a location proximate the second end 584 of the body. The support arm 588 also includes a second portion 594 that extends from the first portion 590 at a location away from the inwardly facing surface 592 of the body 580 in a direction substantially parallel to the inwardly facing surface of the body and from the second end 584 toward the first end 582. A fuse receiving area 596 is defined between the inwardly facing surface 592 of the body 580 and the first and second portions 590, 594 of the fuse support arm 588.

As shown in FIG. 27, the fuse receiving area 596 is sized to receive and retain a fuse 600, similar to fuses 131, 132 described above. The fuse 600 includes first and second conductive ends 601, 603. In the illustrated embodiments, the second portion 594 of the support arm 588 has a length of at least half the length of the fuse 600. For laterally supporting the fuse, i.e., to resist lateral movement of the fuse, the fuse carrier 564 can also include lateral support arms 602 extending from the carrier body 580 to the second portion 594 of the support arm 588. Further, longitudinal movement of the fuse 600 away from the second end 584 of the carrier body 580 can be resisted by a stop 611 extending transversely from the inwardly facing surface 592 of the carrier body at a location proximate the first end 582 of the body.

The support arm 588 can be resiliently movable relative to the body 580 to removably secure fuse 600 within the fuse receiving area 596 in, for example, a snap-fit type arrangement. For example, the fuse 600 can be inserted into the fuse receiving area such that the fuse contacts and causes the support arm 588 to move. As the fuse 600 is fully inserted into the fuse receiving area 596, the support arm 588 resiliently moves back into an unbiased state and the stop 611 and lateral support arms 602 retain the fuse in the fuse receiving area. A user can remove the fuse 600 from the fuse receiving area 596 by grasping the fuse from end 601 and pulling the fuse in a partially downwardly direction to overcome the biasing force of the support arm 588 and move the arm downwardly away from the body. The fuse 600 can then be slide out of the fuse receiving area 596.

Figure 28:
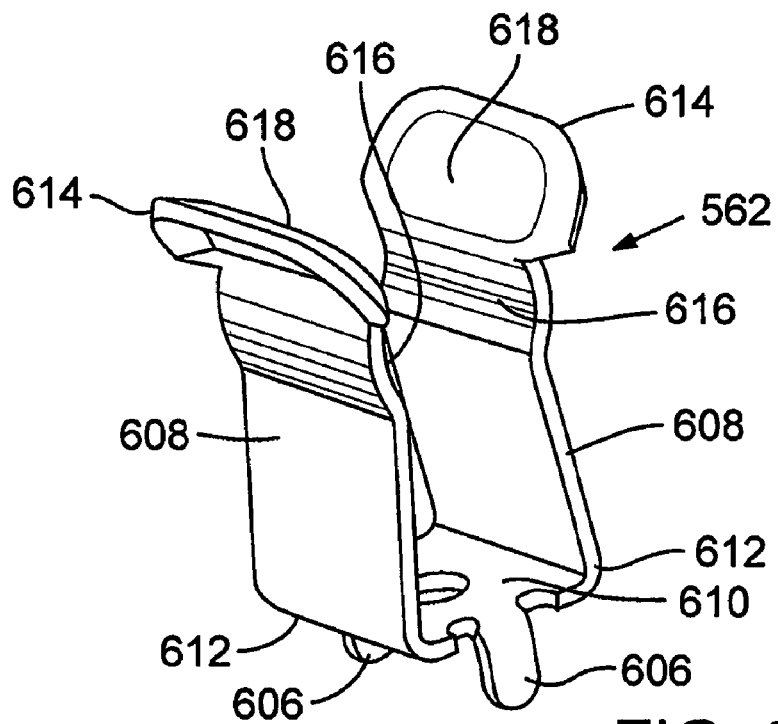
FIG. 28 is a perspective view of an exemplary fuse terminal associated with the fuse module of FIG. 25.

Referring to FIG. 28, terminal, or clip, 562, exemplary of the terminals of the present disclosure, is shown having printed circuit board connectors, or tabs, 606 extending away from opposing fuse clamp arms 608. The circuit board connectors 606 extend from a terminal base 610 approximately transversely to the base. The fuse clamp arms 608 are each coupled to the terminal base 610 at a fixed end 612 of the arms, extend generally transversely to the base, and terminate at a free end 614 away from the base.

The fuse clamp arms 608 are flexible to allow movement of the arms away from each other when pressure exceeding a biasing force of the arms is applied to the arms. The arms 608 are resilient in that they return to an un-stressed or un-flexed state when the pressure is released. The fuse clamp arms 608 include opposing curved recessed portions 616 intermediate the fixed end 612 and the free end 614 of the arms. Preferably, the curved recessed portions 616 have a contour that approximately corresponds with the external surface of the ends 601, 603 of fuse 600. Further, the free ends 614 of the fuse clamp arms 608 may have opposing beveled or angled surfaces 618 generally facing each other and adjoining the recessed portions 616. In the un-stressed or un-flexed state, a maximum lateral distance between the opposing recessed portions 616 and a minimum lateral distance between the beveled surfaces 618 is smaller than an outer diameter of the ends 601, 603 of the fuse 600. Preferably, the maximum lateral distance between opposing recessed portions 616 is greater than the minimum lateral distance between the beveled surfaces 618.

Figure 30:
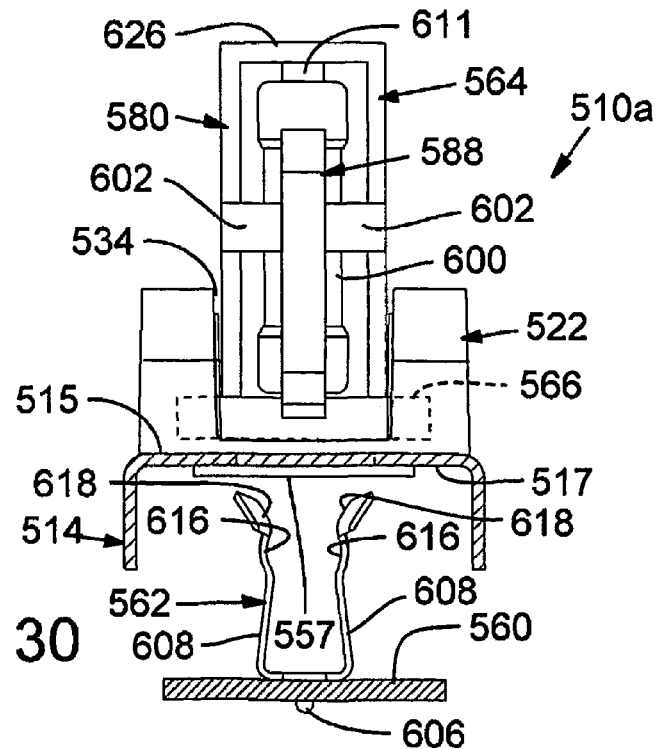
FIG. 30 is a frontal view of the fuse module of FIG. 25.

Referring now to FIGS. 29 and 30, a pair of fuse clips 562 is attached to the printed circuit board 560 by inserting the circuit board connectors 606 into corresponding apertures, or plugs, 620 in the printed circuit board and securing the connectors to the printed circuit board, such as by soldering. In an exemplary embodiment, one of the pair of fuse terminals 562 is a power input fuse terminal and the plug 620 in which it is inserted is electrically connected to one of the power input connections via the printed circuit board circuitry. The other of the pair of fuse terminals 562 is a power output fuse terminal and the plug 620 in which it is inserted is electrically connected to a power output connection, and thus one or more power outlets 518, via the printed circuit board circuitry.

The fuse carrier 564 is shown rotatably mounted to the base 522 in a first or opened position in FIGS. 29 and 30. In the opened position, the fuse receiving area 596 of the carrier 564 is disposed outside of, or external to, the housing 512 such that fuse 600 retained within the fuse receiving area is correspondingly disposed outside of the housing. In some implementations, the cylindrical portion 566 of the carrier 564 includes a stop 622 that contacts the carrier support surface 532 of the base 522 to prevent over-rotation of the carriers.

From the open position, a user can apply a pressure against the user engaging portion 568 of the fuse carrier 564 to rotate the carrier about an axis that is coaxial with the cylindrical portion 566 in a direction indicated by arrow 623 (see FIG. 29). The carrier 564 can be rotated by the user in the direction indicated by arrow 623 until a shoulder portion 626, extending from the carrier body 580 and coextensive with the outwardly facing surface 586 of the body, contacts the carrier support surface 532 to resist further rotation of the fuse carrier and to place the carrier in a second or closed position (see FIG. 31), thus retracting the fuse carrier from the open position to the closed position.

Figure 32:
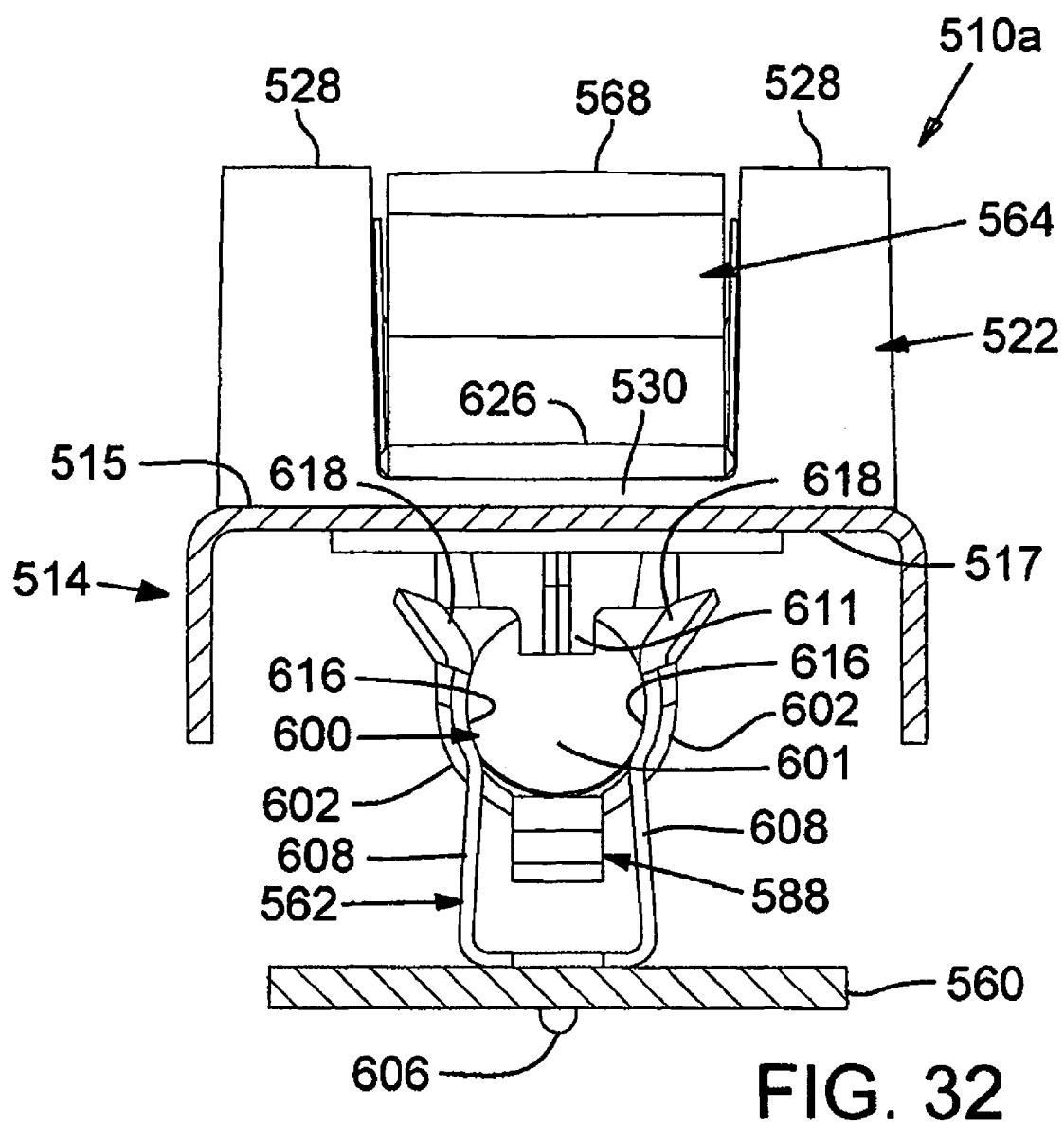
FIG. 32 is a frontal view of the fuse module of FIG. 25.

Referring to FIGS. 31 and 32, the fuse carrier 564 is shown in the second or closed position. In this position, the fuse receiving area 596 of the carrier 564 is disposed within the interior of the housing 514 such that fuse 600 retained within the fuse receiving area is correspondingly disposed within the interior of the housing.

As the fuse carrier 564 is rotated from the open position to the closed position, the first and second ends 601, 603 of the fuse 600 contact respective beveled surfaces 618 of the fuse clips 562. Since the maximum distance between at least a portion of the respective beveled surfaces 618 of the clips is smaller than the outer diameter of the ends 601, 603 of the fuses, further rotation of the carrier 564 causes the first and second ends 601, 603 of the fuse 600 to slide against and apply pressure to the respective beveled surfaces 618 of the clips 562. Such pressure, if greater than the biasing force of the clamp arms 608, urges the arms to move away from each other until the ends 601, 603 of the fuse 600 slide into the respective opposing curved recessed portions 616 of the arms. The clamp arms 608, being resilient and biased toward the un-flexed state, move toward each other to effectively clamp the ends 601, 603 of the fuse 600 between the recessed portions 616 of the arms (see FIG. 32).

In the closed position, the power input fuse terminal is electrically connected to the first end 601 of fuse 600 and the power output fuse terminal is electrically connected to the second end 603 of the fuse. With functional, i.e., un-blown, fuses connected to the terminals in this manner, a closed circuit is formed between the power input and the power outlets 518. In other words, power from the power input 512 can be transmitted to the power outlets 518 via the power input fuse terminal, the fuse, and the power output fuse terminal.

In preferred embodiments, the power distribution unit 512, or other electrical device, includes a fuse condition indicator so that the state of the fuse may be determined by visual inspection. For example, referring to FIG. 1, fuse condition indicators 620 are displays electrically coupled to the fuse 600 and provide a visual indication as to whether the fuse is active, i.e., operable, or blown, i.e., inoperable. The displays can be analog or digital displays and indicate the status of the one or more fuses or the level of power being transmitted to a particular bank of outlets. In the latter example, if the level of power displayed falls below a predetermined level indicative of a blown fuse, a user can visually determine if the fuse is active or blown.

Although not shown, in some implementations, the fuse condition indicator is a light emitting diode (LED) similar to those shown in FIGS. 15-18 and described above in more detail. The LED may be on or off in correspondence with the state of the fuse.

When a fuse is blown and/or requires replacement, the fuse module 510a can be used to easily disconnect and access the fuse without tools or disassembly. For example, if fuse 600 is blown, as indicated by a fuse condition indicator or otherwise determined, a user can rotate the carrier 564 from the closed position to the open position. This is accomplished by applying a pressure that exceeds the biasing force of the clamp arms 608 on the user engaging portion 568 in a direction indicated by arrow 624 (see FIG. 31). Upon initial rotation of the carrier 564, the clamp arms 608 are urged away from each other by the fuse 600 as the fuse ends 601, 603 slide out of the respective opposing recessed portions 616 to effectively un-clamp, i.e., disconnect, the fuse from the terminals 608. The carrier 564 is rotated into the open position as indicated in FIGS. 29 and 30 such that the fuse 600 is accessible external to the housing 514, thus retracting the fuse carrier from the closed position to the open position.

With the carrier in the open position, a user can manually access the fuse 600 and remove it from the carrier 564 by gripping the first end of the fuse 601 and urging it in a direction away from the carrier body 580 such that the first end of the fuse clears the stop 611. Once the first end 601 of the fuse 600 clears the stop 611, the user can urge the fuse away from the first portion 590 of the fuse support arm 588. In this manner, the fuse 600 can be removed from the fuse receiving area 596 and thus the carrier 564. A new or operable fuse can then be inserted into and retained within the fuse receiving area 596 of the carrier 564. Finally, a user can rotate the carrier 564 from the open position in the direction indicated by arrow 623 to the closed position such that the new fuse is connected to the terminals 562.

In some embodiments, the base 522 and carrier 564 are made from a non-conductive material, such as plastic, and can be manufactured using common molding techniques known in the art. However, in some embodiments, the base 522 is made from a conductive material (see, e.g., FIG. 34). The terminals, e.g., terminal 562, can also be made from a conductive material. As used herein, a conductive material can be any of various conductive materials, such as a conductive metal or metal alloy. For example, in some implementations, the conductive material is one or more of copper, nickel and aluminum.

Although the fuse modules 510a, 510b, 510c, 510d, 510e, 510f of the present disclosure are shown and described as having a single carrier 564 facilitating access to a single fuse 600, it is recognized that the same features and principles can be applied to fuse modules having more than one carrier for accessing more than one fuse. For example, as shown in FIG. 33, a fuse module 700 having two carriers 714, 716 in tandem, with each carrier providing access to a separate fuse, is shown mounted to housing 718 of a PDU. The base 712 of the module 700 is similar to the base 522 shown in FIGS. 24-32, except that the base 712 is lengthened and includes a duplicate set of carrier receiving features to accommodate an additional carrier. Further, the carriers 714, 716 are similar to carrier 564 shown in FIGS. 24-32 and are retractable in a similar manner to electrically disconnect from a printed circuit board 720 and provide access to fuses retained by the carriers. As can be recognized, the fuse module 700 shown in FIG. 33 can include the same components and features as described above for module 510a except having duplicate components where applicable.

Figure 34:
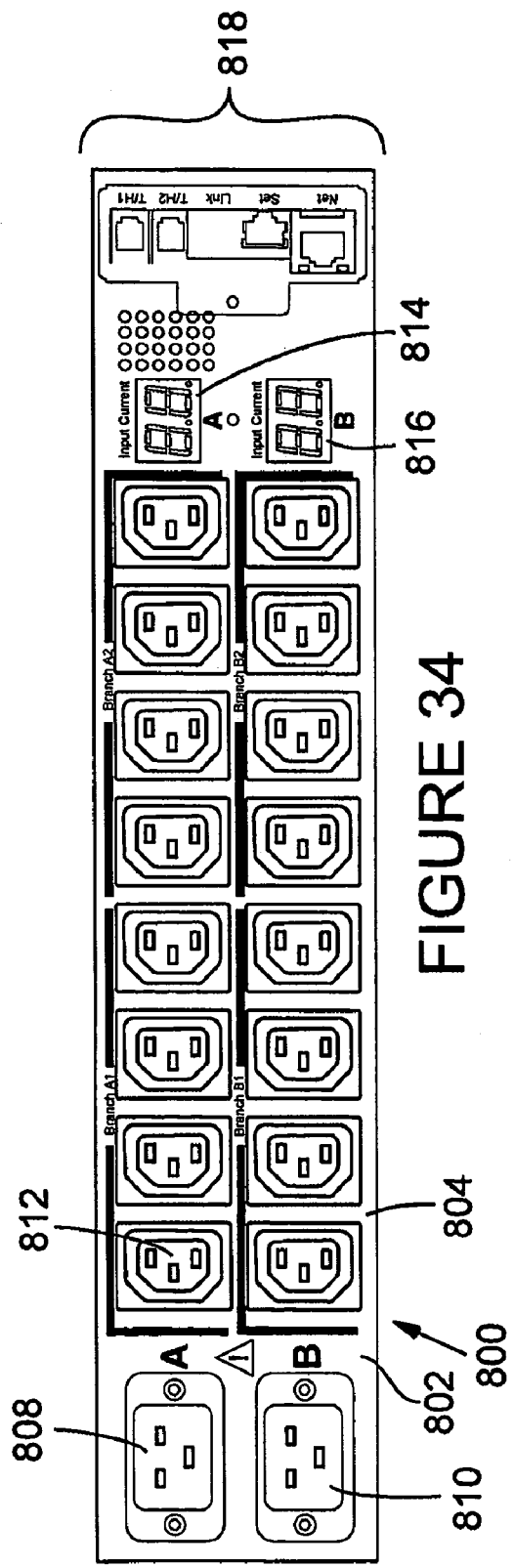
FIG. 34 is a front elevation view of another embodiment of a horizontally mountable power distribution unit showing power inputs and a plurality of power outputs mounted to a housing of the power distribution unit.
Figure 35:
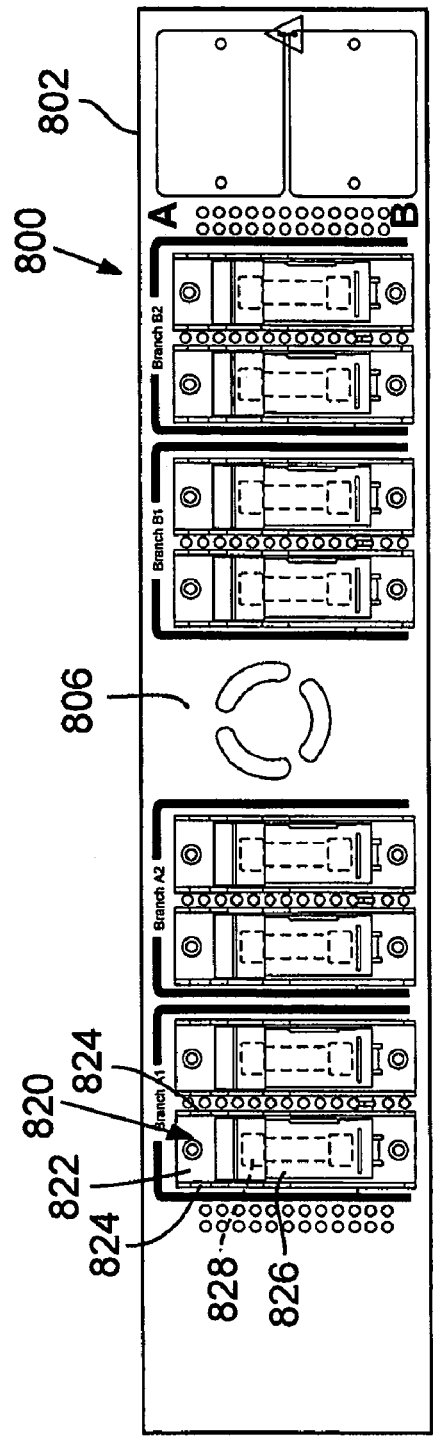
FIG. 35 is a rear elevation view of the power distribution unit of FIG. 34 showing a plurality of fuse modules displaced along the power distribution unit housing.
Figure 36:
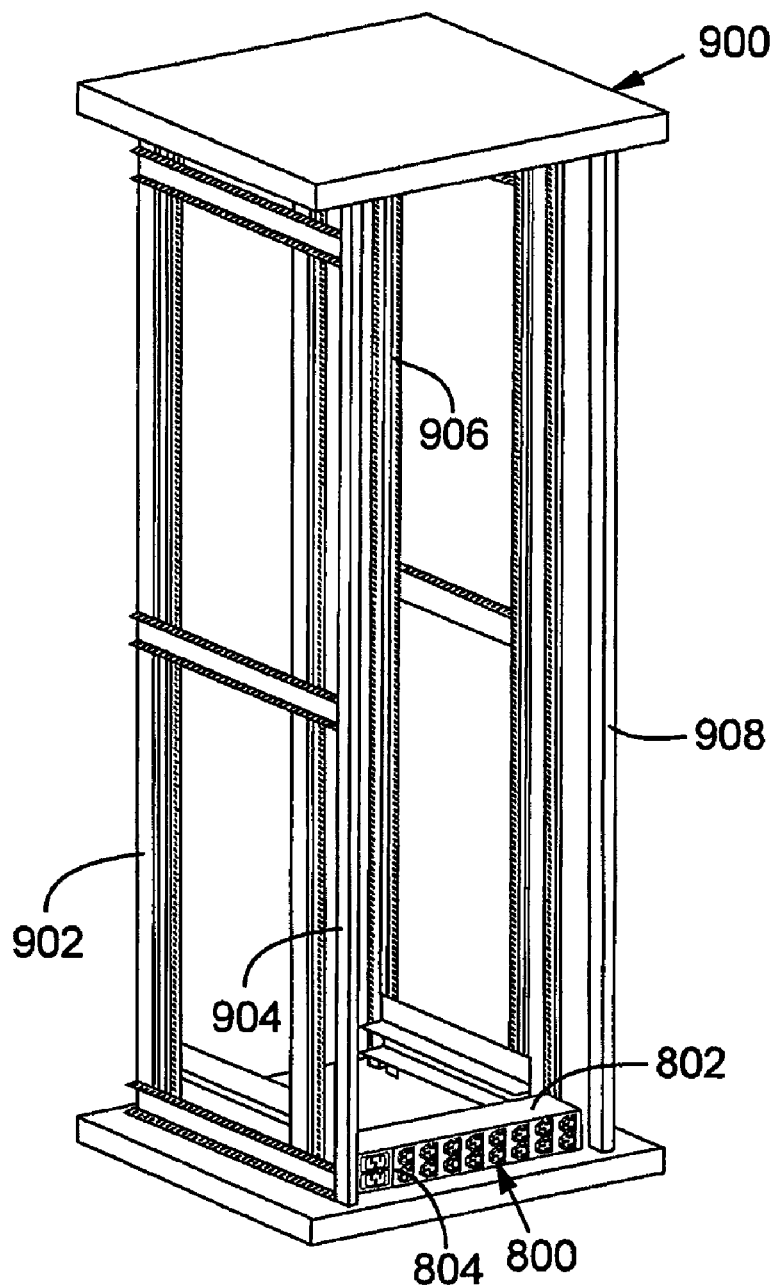
FIG. 36 is a perspective view of the power distribution unit of FIG. 34 mounted horizontally in an electronic equipment rack.

Referring now to FIGS. 34-36, a PDU, such as PDU 800, can be configured for horizontal mounting within an electronic equipment rack, such as electronic equipment rack 900, which is similar to electronic equipment rack 430 described above. The PDU 800 is similar to PDU 1, 512 described above in that it includes a housing 802, a front panel 804, rear panel 806, first and second power inputs 808, 810, a plurality of power outlets, with outlet 812 being representative of such outlets, and fuse access openings (not shown).

However, PDU 800 has certain differences in comparison to PDU 1, 512. For example, PDU 800 has a 2 U unit height and is configured for horizontal mounting within an electronic equipment rack. More specifically, the housing 802 has an overall length that is substantially less than the overall length of PDU 1, 512. The length of the PDU housing 802 can be less than a width of the interior of the rack 900. The width of the interior of the rack 900 can be defined as the minimum distance between right hand side vertically extending rails 902, 904 and respective left hand side vertically extending rails 906, 908. Accordingly, as shown in FIG. 36, the PDU 800 can mounted horizontally within the confines, e.g., between respective vertically extending rails 902, 904 and 906, 908, of the rack 900.

Although the PDU 800 is shown mounted horizontally proximate a bottom rear portion of the rack, in other embodiments, the PDU 800 could be mounted horizontally at any of various locations within the rack, such as, for example, a top rear portion of the rack or a middle rear portion of the rack.

Referring to FIG. 34, the housing 802 of the PDU 800 includes an elongate front panel 804 on which the plurality of outlets 812 and the first and second power inputs 808, 810 are displaced. The housing can also include current indicators 814, 816 and communications ports 818 displaced on the front panel 804.

The first and second power inputs 808, 810 and the plurality of power outlets are electrically connected to fuse modules, such as representative fuse module 820, mounted to and at least partially positioned within fuse access openings (not shown) formed in the back panel 806. Fuse module 820 is similar to fuse module 510a described above. However, fuse module 820 includes a base 822 having sidewalls 824 that are narrower and shorter than sidewalls 528 of fuse module 510a. In some embodiments, the base 822 is made from a metal, which is some instances, allows the base to be less bulky, e.g., narrower and shorter sidewalls, than if made with a plastic, while providing sufficient strength and rigidity to comply with safety regulations.

The fuse module 820 has a movable fuse carrier 828 removably securing a fuse 828. As with fuse module 510a, the movable fuse carrier 828 can be moved, such as by rotating, between (i) a first position in which the fuse 828 is electrically coupled to the first or second power input and at least one of the plurality of outlets; and (2) a second position which the fuse prevented from being electrically connected to the power inputs and power outlets.

Although the fuse carrier of the illustrated embodiments is shown as retaining a single fuse, it is recognized that in some embodiments, the fuse carrier of the present disclosure can be modified to retain more than one fuse.

Also, in addition to a fuse module having a retractable fuse carrier that pivots with respect to a fuse module base, other approaches to providing a fuse carrier that is repositionable relative to a fuse module base can be used.

In view of the many possible embodiments to which the principles of the disclosure may be applied, it should be recognized that the illustrated embodiments are only preferred examples and should not be taken as limiting in scope. Rather, the scope is defined by the following claims. We therefore claim as our invention all that comes within the scope and spirit of these claims.

We claim:

1. An electronic equipment rack assembly, comprising:
an electronic equipment rack for housing electronic equipment;
a power distribution unit mounted to the electronic equipment rack, the power distribution unit being in power receiving communication with at least one power source and having at least one power outlet capable of being in power supply communication with electronic equipment, the power distribution unit comprising a housing having at least one fuse access passage; and at least one fuse module mounted to the housing and disposed at least partially within the at least one fuse access passage, the at least one fuse module being electrically coupled to the at least one power source and electrically couplable to the at least one power outlet, wherein the at least one fuse module comprises (i) a base fixed relative to the housing and (ii) at least one fuse holder attached to the base and movable between a first position in which a fuse held by the fuse holder is electrically couplable to the at least one power source and power outlet and a second position in which a fuse held by the fuse holder is not electrically couplable to the at least one power source and power outlet.

2. The electronic equipment rack assembly of claim 1, wherein the power distribution unit is vertically mounted to the electronic equipment rack.

3. The electronic equipment rack assembly of claim 1, wherein the power distribution unit is horizontally mounted to the electronic equipment rack.

4. The electronic equipment rack according to claim 1 wherein said at least one fuse holder is pivotally attached to the base and pivotally movable between the first position and the second position.

5. A power distribution unit vertically mountable in a vertical electronic equipment rack, comprising:

a long, thin vertical plugstrip housing mountable in a vertical orientation in a back portion of the electronic equipment rack, said vertical plugstrip housing having at least one fuse access passage;

at least one power source penetrating the power distribution unit housing;

at least one power outlet capable of being in power supply communication with electronic equipment; and at least one fuse module mounted to the housing and disposed at least partially within the at least one fuse access passage, the at least one fuse module being electrically coupled to the at least one power source and electrically couplable to the at least one power outlet, wherein the at least one fuse module comprises (i) a base fixed relative to the housing and (ii) at least one fuse holder attached to the base and movable between a first position in which a fuse held by the fuse holder is electrically couplable to the at least one power source and power outlet and a second position in which a fuse held by the fuse holder is not electrically couplable to the at least one power source and power outlet.

6. The power distribution unit according to claim 4 wherein said at least one fuse holder is pivotally attached to the base and pivotally movable between the first position and the second position.

* * * * *

UNITED STATES PATENT AND TRADEMARK OFFICE
CERTIFICATE OF CORRECTION

| | | |
|---|---|---|
| PATENT NO. | : 8,004,827 B2 | Page 1 of 1 |
| APPLICATION NO. | : 12/820129 | |
| DATED | : August 23, 2011 | |
| INVENTOR(S) | : Carrel W. Ewing et al. | |

It is certified that error appears in the above-identified patent and that said Letters Patent is hereby corrected as shown below:

In the Detailed Description:

Column 13, line 47, "each coupled tout least one" should read --each coupled to at least one--.

Column 16, line 5, "spaced form each other" should read --spaced from each other--.

Column 17, line 59, "510a, 510b, 510c, 510c1, 510e, 510f" should read --510a, 510b, 510c, 510d, 510e, 510f--.

Signed and Sealed this
Eighteenth Day of October, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,004,827 B2 | Page 1 of 1 |
| APPLICATION NO. | : 12/820129 | |
| DATED | : August 23, 2011 | |
| INVENTOR(S) | : Ewing et al. | |

It is certified that error appears in the above-identified patent and that said Letters Patent is hereby corrected as shown below:

In the claims
Column 26, line 22, claim 6, delete "claim 4" and insert -- claim 5 --, therefor.

Signed and Sealed this
Ninth Day of February, 2016

Michelle K. Lee
*Director of the United States Patent and Trademark Office*